(12) United States Patent
Cho

(10) Patent No.: US 12,057,173 B2
(45) Date of Patent: Aug. 6, 2024

(54) PAGE BUFFER CIRCUIT AND MEMORY DEVICE INCLUDING THE SAME

(71) Applicant: Samsung Electronics Co., Ltd., Suwon-si (KR)

(72) Inventor: Yongsung Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 72 days.

(21) Appl. No.: 17/836,453

(22) Filed: Jun. 9, 2022

(65) Prior Publication Data

US 2023/0154544 A1 May 18, 2023

(30) Foreign Application Priority Data

Nov. 17, 2021 (KR) .......................... 10-2021-0158925

(51) Int. Cl.
*G11C 16/24* (2006.01)
*G11C 16/26* (2006.01)

(52) U.S. Cl.
CPC .............. *G11C 16/24* (2013.01); *G11C 16/26* (2013.01)

(58) Field of Classification Search
CPC .......... G11C 16/24; G11C 16/26; G11C 16/28
See application file for complete search history.

(56) References Cited

U.S. PATENT DOCUMENTS

| | | | |
|---|---|---|---|
| 7,016,230 B2 | 3/2006 | Hosono | |
| 7,379,340 B2 | 5/2008 | Hosono et al. | |
| 10,297,326 B2 | 5/2019 | Kamata et al. | |
| 10,497,448 B2 | 12/2019 | Arakawa | |
| 10,546,875 B2 | 1/2020 | Kim et al. | |
| 10,755,790 B2 | 8/2020 | Yeh et al. | |
| 2006/0291288 A1* | 12/2006 | Kang | G11C 16/26 365/185.21 |
| 2015/0243673 A1* | 8/2015 | Oh | G11C 16/0466 365/185.11 |
| 2017/0365348 A1* | 12/2017 | Kamata | G11C 16/26 |
| 2022/0045080 A1 | 2/2022 | Cho et al. | |

* cited by examiner

*Primary Examiner* — Han Yang
(74) *Attorney, Agent, or Firm* — Harness, Dickey & Pierce, P.L.C.

(57) ABSTRACT

A memory device includes a memory cell array, and a page buffer circuit connected to the memory cell array through a plurality of bit lines, including a plurality of page buffers arranged in correspondence with the bit lines and each of which includes a sensing node. The plurality of page buffers include a first page buffer, and the first page buffer includes: a first sensing node configured to sense data by corresponding to a first metal wire at a lower metal layer; and a second metal wire electrically connected to the first metal wire and at an upper metal layer located above the lower metal layer, and a boost node corresponding to a third metal wire adjacent to the second metal wire of the upper metal layer and configured to control a boost-up and a boost-down of a voltage of the first sensing node.

20 Claims, 19 Drawing Sheets

FIG. 6B

|  | Δ(vBL − vCSL) | Δ(vBL − vCSL) |
|---|---|---|
| CASE 1 | 0.3(=0.3−0.0) | 2.0(=2.0−0.0) |
| CASE 2 | 0.3(=1.3−1.0) | 1.0(=2.0−1.0) |
|  | MAINTAIN OFFSET BETWEEN vBL/vCSL | EFFECTIVE vWL DECREASE |

PAGE BUFFER CIRCUIT AND MEMORY DEVICE INCLUDING THE SAME

CROSS-REFERENCE TO RELATED APPLICATION

This application is based on and claims priority under 35 U.S.C. § 119 to Korean Patent Application No. 10-2021-0158925, filed on Nov. 17, 2021, in the Korean Intellectual Property Office, the disclosure of which is incorporated by reference herein in its entirety.

BACKGROUND

Various example embodiments relate to a memory device, and more particularly, to a page buffer circuit and/or a memory device including the page buffer circuit.

According to a recent tendency of multifunctionalization of information and communication devices, a larger capacity and a higher degree of integration of memory devices have been required. A memory device may include a page buffer circuit for storing data in memory cells or for outputting data from the memory cells. For example, the page buffer circuit may include a plurality of page buffers arranged in correspondence with a plurality of bit lines, and each page buffer may include semiconductor devices, such as a transistor. A demand or desire for page buffers having a smaller size and/or advances in process technology owing to an increased degree of integration of memory devices may result in reduction in size of semiconductor devices included in the page buffer, and accordingly, a layout of wires connected to the semiconductor devices may become complex.

Moreover, in a data read operation of a memory device, a sensing node monitoring a current flowing through a memory cell may be implemented in the page buffer, and a decrease in size of the page buffer may give rise to limitations in implementing the sensing node and/or in controlling the same.

SUMMARY

Inventive concepts provide a memory device with a page buffer reduced in size, the memory device capable of improving reliability in a read operation of the memory device.

According to some example embodiments, there is provided a memory device including: a memory cell array including a plurality of memory cells; and a page buffer circuit connected to the memory cell array through a plurality of bit lines. The page buffer circuits includes a plurality of page buffers which are arranged in correspondence with the bit lines and each of which includes a sensing node. The plurality of page buffers include a first page buffer, and the first page buffer includes a first sensing node configured to sense data, the first sensing node corresponding to a first metal wire at a lower metal layer, and a second metal wire electrically connected to the first metal wire and arranged at an upper metal layer located above the lower metal layer. The first page buffer includes a boost node corresponding to a third metal wire adjacent to the second metal wire of the upper metal layer and configured to control a boost and a boost-down of a voltage of the first sensing node.

According to some example embodiments, there is provided a page buffer circuit including a memory cell array including a plurality of memory cells, and a page buffer circuit connected to the memory cell array through a plurality of bit lines, the page buffer circuit including first to fourth page buffers which are side-by-side in correspondence with the bit lines and each of which includes a sensing node. Each of the first to fourth page buffers includes an upper metal layer region and a lower metal layer region, the lower metal region including one or more metal wires extending in a first direction, a first sensing node of the first page buffer is configured to sense data, the first sensing node corresponding to a first metal wire in a lower metal layer region, the lower metal region corresponding to the first page buffer, and to a second metal wire electrically connected to the first metal wire through a contact, the first metal wire extending in a second direction perpendicular to the first direction and arranged in an upper metal layer region corresponding to the second page buffer, and the upper metal layer region corresponding to the second page buffer includes a first boost node configured to control a boost-up and a boost-down of a voltage of the first sensing node, the first sensing node corresponding to a third metal wire adjacent to the second metal wire.

According to some example embodiments, there is provided a page buffer circuit including a first page buffer and a second page buffer which are arranged side by side in correspondence with a plurality of bit lines, each of the first and second page buffer includes an upper metal layer region and a lower metal layer region, the lower metal layer region including one or more metal wires extending in a first direction are arranged, wherein a first sensing node of the first page buffer corresponds to a first metal wire in the lower metal layer region corresponding to the first page buffer, and a second metal wire electrically connected to the first metal wire through a contact extending in a second direction perpendicular to the first direction and arranged in the upper metal layer region corresponding to the second page buffer. A second sensing node of the second page buffer corresponds to a third metal wire in a lower metal layer region corresponding to the second page buffer, and a fourth metal wire electrically connected to the third metal wire and arranged in the upper metal layer region corresponding to the second page buffer. In at least one of an upper metal layer region corresponding to the first page buffer and the upper metal layer region corresponding to the second page buffer, a boost node correspond to the second metal wire and the fourth metal wire and is configured to control a boost and a boost-down of a voltage of the first sensing node and the second sensing node.

BRIEF DESCRIPTION OF THE DRAWINGS

Embodiments of inventive concepts will be more clearly understood from the following detailed description taken in conjunction with the accompanying drawings in which:

FIGS. 6A, 6B, and 6C are diagrams showing a case of reading data based on a virtual negative method;

DETAILED DESCRIPTION OF VARIOUS EXAMPLE EMBODIMENTS

Hereinafter, some example embodiments will be described in detail with reference to the accompanying drawings.

Figure 1:
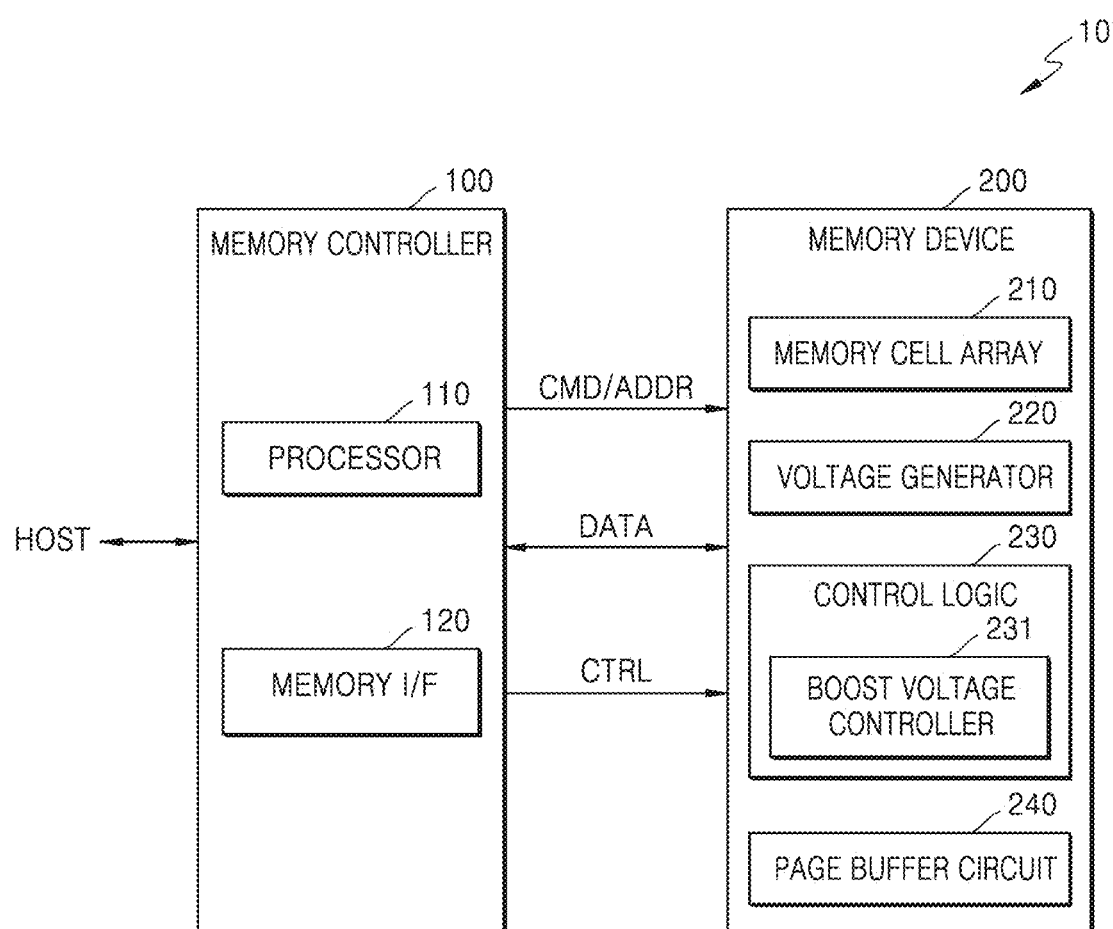
FIG. 1 is a block diagram of a memory device according to some example embodiments.

FIG. 1 is a block diagram of a memory system according to some example embodiments.

With reference to FIG. 1, a memory system 10 may include a memory controller 100 and a memory device 200, the memory device 200 may include a memory cell array 210, a voltage generator 220, a control logic 230, and a page buffer circuit 240, and the control logic 230 may include a boost voltage controller 231. Although FIG. 1 illustrates that the boost voltage controller 231 is provided in the control logic 230, the boost voltage controller 231 according to some example embodiments of inventive concepts may be implemented as a separate component outside the control logic 230.

For example, the memory system 10 may communicate with a host through various interfaces, for example, one or more of a universal serial bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA interface, a parallel-ATA interface, a small computer small interface (SCSI), an enhanced small disk interface (ESDI), an integrated drive electronics (IDE) interface, a firewire, a universal flash storage (UFS) interface, a nonvolatile memory express (NVMe) interface, etc.

According to some example embodiments, the memory device 200 may include a nonvolatile memory device. In some example embodiments, the memory system 10 may be implemented as a memory embedded in or removable from an electronic device, and for example, the memory system 10 may be implemented in various forms, such as one or more of an embedded universal flash storage (UFS) memory device, a solid state drive (SSD), a UFS memory card, a compact flash (CF) card, a secure digital (SD) card, a micro-SD card, a mini-SD card, an extreme digital (xD) card, a memory stick, etc. Furthermore, the memory system 10 may be referred to as a storage device storing data in a nonvolatile manner.

The memory controller 100 may control the memory device 200 to read data stored in the memory device 200 and/or to write data to the memory device 200 in response to a read/write request from a host HOST. For example, the memory controller 100 may include a processor 110 and a memory interface 120, and the processor 110 may control all operations in the memory controller 100 and memory operations performed on the memory device 200. Specifically, the memory controller 100 may provide an address ADDR, a command CMD, and a control signal CTRL to the memory device 200 through the memory interface 120 to control one or more of write, read, and erase operations performed on the memory device 200. Furthermore, data DATA to be stored in the memory device 200 and data DATA read from the memory device 200 may be received and transmitted between the memory controller 100 and the memory device 200.

The memory cell array 210 may include a plurality of memory cells, and the plurality of memory cells may be, for example, flash memory cells. Hereinafter, various example embodiments of inventive concepts are described in detail by taking an example in which the plurality of memory cells are NAND flash memory cells. However, inventive concepts is not limited thereto, and in some example embodiments, the plurality of memory cells may be or may include resistive memory cells, such as one or more of resistive random access memory (ReRAM), phase change RAM (PRAM), or magnetic RAM (MRAM).

In some example embodiments, the memory cell array 210 may include a three-dimensional (3D) memory cell array, the 3D memory cell array may include a plurality of cell strings, and each cell string may include memory cells respectively connected to word lines vertically stacked on a substrate. However, inventive concepts is not limited thereto. In some example embodiments, the memory cell array 210 may include a two-dimensional (2D) memory cell array, and the 2D memory cell array may include a plurality of cell strings arranged in a row or column direction.

The voltage generator 220 may generate various voltages used in the memory device 200, and for example, the voltage generator 220 may generate a program voltage for a program operation and a read voltage for a read operation. Moreover, the voltage generator 220 may diversely adjust a level of the program voltage and the read voltage based on the control by the control logic 230. For example, the voltage generator 220 may provide a read voltage having various levels to distinguish between multiple threshold voltage distributions.

The control logic 230 may control all operations of the memory device 200, and for example, the control logic 230 may output various internal control signals to program data to the memory cell array 210 or read data from the memory cell array 210, based on the command CMD, the address ADDR, and the control signal CTRL received from the memory controller 100. Furthermore, the control logic 230 may output a voltage control signal (not shown) to adjust a level of various voltages output from the voltage generator 220 with respect to a program operation, a read operation, and an erase operation.

The page buffer circuit 240 may include a plurality of page buffers PB arranged in correspondence with a plurality of bit lines. For example, each page buffer PB may include a sensing node, be connected to a memory cell through a corresponding bit line, and monitor a current flowing in the sensing node in the process of reading data to determine a logic state of data stored in the memory cell (or, whether the memory cell is an on-cell or an off-cell).

According to some example embodiments, the sensing node provided in each page buffer PB may be implemented by or may correspond to a metal wire (or a metal line)

arranged in at least two metal layer regions. For example, an upper metal layer region and a lower metal layer region constituting or included in each page buffer PB may be defined, and each of the upper metal layer region and the lower metal layer region may include at least one metal wire. For example, the sensing node of each page buffer PB may include or correspond to a metal wire of the lower metal wire region and a metal wire electrically connected to the metal wire of the lower metal layer region through a contact and arranged in the upper metal layer region to sense data of the memory cell.

Furthermore, according to some example embodiments, the page buffer PB may further include a boost node implemented by a metal wire to control a boost and/or a boost-down of the sensing node. For example, the boost node of the page buffer PB may be arranged at the upper metal layer, and thus be adjacent to the metal wire constituting or included in the sensing node arranged at the upper metal layer. Accordingly, the boost/boost-down of the sensing node may be controlled. The boost voltage controller 231 may further output a boost voltage control signal to adjust a level of a voltage provided to the boost node (e.g., a boost voltage), and for example, the voltage generator 220 may increase or reduce a level of a boost voltage provided to the boost node, based on the boost voltage control signal.

Figure 6A:
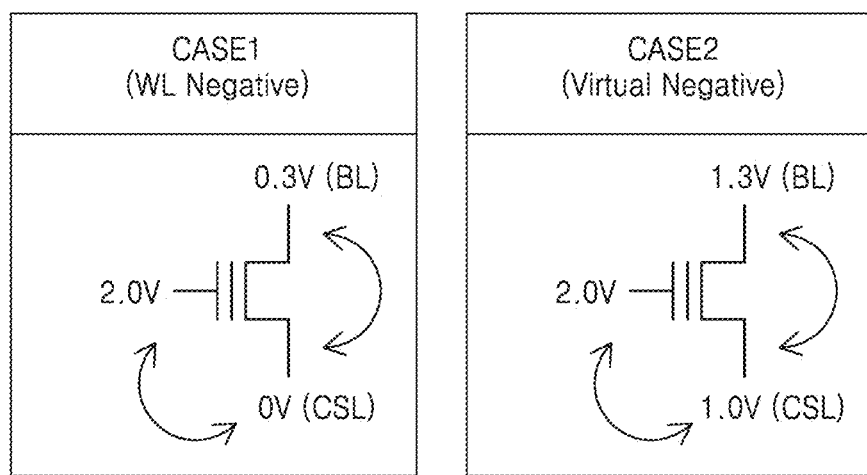
Figure 6C:
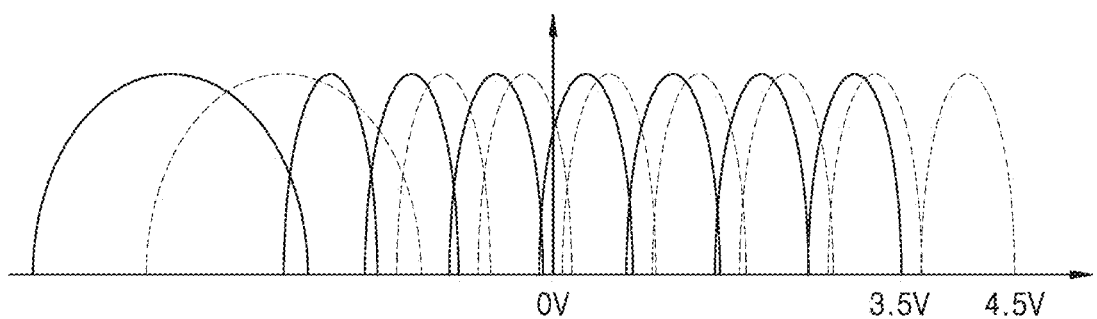

Hereinafter, detailed operations performed in various example embodiments are described. FIGS. 6A, 6B, and 6C are diagrams showing a case of reading data based on a virtual negative method.

As for a data read operation, a threshold voltage of the memory cell may be determined by monitoring an amount of cell current for a certain time (for example, a develop section) through the sensing node in the page buffer PB. The monitoring may be based on a particular word line voltage level, and in this manner, whether the memory cell is an off-cell or an on-cell may be determined. For example, based on the word line voltage level, the threshold voltage of the memory cell may be defined and/or determined.

With reference to FIGS. 6A and 6B, in CASE 1, a ground voltage (e.g., 0 V) may be applied to a common source line CSL of a cell string, a word line voltage may have a level of 2.0 V, and a voltage level of a bit line BL may be 0.3 V. At this time, a voltage level difference between the word line voltage and the common source line CSL voltage may be 2.0 V, and a voltage level difference between the bit line BL voltage and the common source line CSL voltage may be 0.3 V.

On the contrary, in CASE 2 (e.g., a virtual negative method), to which various example embodiments of inventive concepts are applied, when a positive voltage (e.g., 1.0 V) is applied to the common source line CSL, a voltage level difference between the word line voltage and the common source line CSL voltage may be reduced to 1.0 V, and accordingly, an effective word line voltage level may be relatively lowered. For example, even when the same word line voltage level is applied, a memory cell having a relatively lower threshold voltage may be determined as to whether it is an on-cell or an off-cell. Meanwhile, in CASE 2, as the voltage level of the common source line CSL is increased, to maintain a swing in a sensing reference current region of a cell current of the memory cell, it is necessary or desirable to increase a voltage level of the bit line BL voltage, and in this regard, FIG. 6A illustrates an example where the bit line voltage level is set to 1.3 V.

Also, as illustrated in FIG. 6B, in CASE 2, to which various example embodiments of inventive concepts are applied, in comparison with the existing method, a level difference between the bit line voltage and the common source line CSL voltage may be 0.3 V, thereby maintaining an offset, and a level difference between the word line voltage and the common source line CSL voltage may be reduced to 1.0 V, which leads to a lower effective word line voltage level.

Meanwhile, as illustrated in FIG. 6C, the memory cells may have multiple threshold voltage distributions, and in a low, or in the lowest limit of the threshold voltage distribution may be in a negative bias region. In general, for a verify operation of the program operation or monitoring of threshold voltage distributions of the negative region during the read operation, improvements in reliability, such as an increase in area of negative pump and word line pass switch circuit, may be required or desired. On the contrary, when a positive voltage is applied to the common source line CSL according to CASE 2, to which various example embodiments of inventive concepts are applied, as a low threshold voltage distribution may be monitored under the condition that the same level of word line voltage is applied, the lowest limit effect of the threshold voltage distribution of the memory cells may be more likely to be achieved, for example without an increase in an area of a word line control circuit and/or additional components for reliability improvement.

For example, when the threshold voltage distribution is under-shifted overall, as illustrated in FIG. 6C, a level of maximum threshold voltage distribution of the memory cell may be lowered, and degradation in durability due to charge leakage may be reduced. Alternatively or additionally, when the lowest limit of the threshold voltage distribution is lowered while maintaining a level of the maximum level of the threshold voltage distribution of the memory cell, a gap among the threshold voltage distributions may increase, which may lead to improved reliability of data.

Referring back to 0 FIG. 1, as the level of bit line voltage is increased in the virtual negative method, a voltage level of the sensing node needs to be or is desired to be adjusted to more effectively sense data in the data read operation, and the boost voltage controller 231 may control the level of the voltage provided to the boost node to adjust the voltage level of the sensing node. For example, based on the control by the boost voltage controller 231, the voltage of the boost node may be increased or decreased, and the voltage of the sensing node may correspondingly be boosted or boosted down.

For example, whether a memory cell is an on-cell or an off-cell may determine whether to maintain, or alternatively reduce, a voltage level of the sensing node. In such a case, as the voltage of the sensing node may be developed only in a region having a voltage greater than the bit line voltage level, the voltage of the sensing node may be controlled to be greater than the bit line voltage level through a boost based on the control by the boost voltage controller 231. In addition, to determine whether a memory cell is an on-cell or an off-cell, as a data determination reference, a trip level in the page buffer PB may be arranged at a level lower than the bit line voltage level, and the voltage level of the sensing node may be controlled to be decreased through a boost-down based on the control by the boost voltage controller 231 after the develop section so that the voltage of the sensing node is lower than the trip level according to the data stored in the memory cell.

Figure 2:
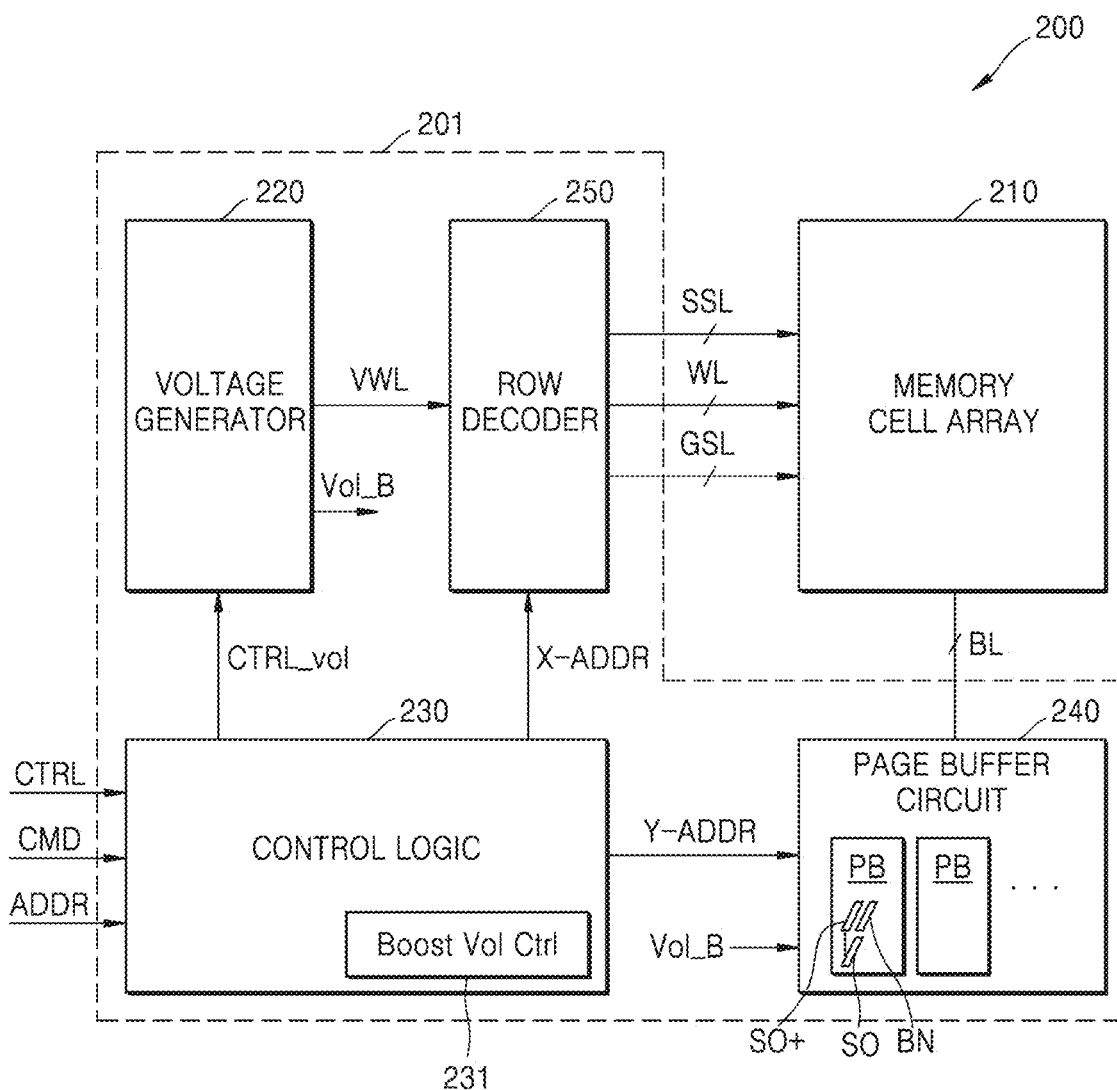
FIG. 2 is a block diagram illustrating various example embodiments of the memory device of FIG. 1.

FIG. 2 is a block diagram illustrating various example embodiments of the memory device 200 of FIG. 1.

With reference to FIG. 2, the memory device 200 may include the memory cell array 210 and a peripheral circuit 201, and the peripheral circuit 201 may include the voltage generator 220, the control logic 230, the page buffer circuit 240, and a row decoder 250. Although it is not shown in FIG. 2, the peripheral circuit 201 may further include other various components related to a memory operation, such as one or more of a column logic, a pre-decoder, a temperature sensor, a command decoder, an address decoder, an input/output interface, etc.

The memory cell array 210 may be connected to the page buffer circuit 240 through bit lines BL, and may be connected to the row decoder 250 through word lines WL, string select lines SSL, and ground select lines GSL. The memory cell array 210 may include a plurality of memory cells, and the plurality of memory cells may be, for example, flash memory cells. Hereinafter, various example embodiments of inventive concepts are described in detail by taking an example in which the plurality of memory cells are NAND flash memory cells. However, inventive concepts is not limited thereto, and in some example embodiments, the plurality of memory cells may be or may include resistive memory cells, such as one or more of ReRAM, PRAM, ferroelectric RAM (FRAM), or MRAM.

In some example embodiments, the memory cell array 210 may include a 3D cell array, the 3D cell array may include a plurality of cell strings, and each cell string may include memory cells respectively connected to word lines vertically stacked on a substrate.

The control logic 230 may output various control signals, for example, one or more of a voltage control signal CTRL_vol, a row address X-ADDR, and a column address Y-ADDR, to write or program data to the memory cell array 210, read data from the memory cell array 210, or erase data stored in the memory cell array 210 based on the command CMD, the address ADDR, and the control signal CTRL. Accordingly, the control logic 230 may control all operations of the memory device 200.

The voltage generator 220 may generate various types of voltages to perform one or more of program, read, and erase operations with respect to the memory cell array 210 based on the voltage control signal CTRL_vol. For example, the voltage generator 220 may generate one or more of a word line voltage, for example, a program voltage, a read voltage, a pass voltage, an erase verify voltage, a program verify voltage, etc. Moreover, the voltage generator 220 may further generate a string select line voltage and a ground select voltage based on the voltage control signal CTRL_vol. Furthermore, the voltage generator 220 may generate one or more voltages to drive or control the page buffer circuit 240, and according to various example embodiments of inventive concepts, the voltage generator 220 may adjust and output a level of a voltage (e.g., a boost voltage Vol_B) applied to the boost node provided at each page buffer PB of the page buffer circuit 240 based on the control by the boost voltage controller 231.

The row decoder 250 may perform select operations with respect to the plurality of word lines WL and the string select lines SSL in response to the row address X-ADDR. In addition, the page buffer circuit 240 may select at least one of the bit lines BL in response to the column address Y-ADDR. Each page buffer PB of the page buffer circuit 240 may operate as a writing driver and/or a sense amplifier according to an operational mode.

The page buffer circuit 240 may include a plurality of page buffers PB arranged in correspondence with a plurality of bit lines BL. Each page buffer PB may be connected to a corresponding bit line BL of the plurality of bit lines BL. The page buffer circuit 240 may temporarily store data read from the memory cell array 210 and/or temporarily store data to be stored in the memory cell array 210. For example, each of the page buffers PB may include one or more latches. The latches may temporarily store data. Here temporarily may refer to a certain predetermined or dynamically determined amount of time.

According to some example embodiments, each page buffer PB may include a sensing node SO implemented through a metal wire arranged at a plurality of metal layers. For example, according to various example embodiments described above, when the virtual negative method is applied in a data read operation, a metal wire constituting the boost node BN may be required or desired for a boost and/or a boost-down of the sensing node SO. Here a node may refer to a point within an electronic component corresponding to a point within an electrical circuit, and the node may correspond to or be a component of a physical structure, such as to a wire or to a plurality of wires.

Assuming that the plurality of metal layers include a lower layer and an upper layer, the sensing node SO may be arranged at or correspond to the lower layer. Moreover, at the lower layer, together with the sensing node SO, a plurality of metal wires for routing among various transistors included in the page buffer PB may be further provided. Accordingly, when the metal wire constituting or corresponding to the boost node is arranged at the lower layer, the size of the page buffer PB may increase, which may give rise to limitation on implementation of the page buffer PB.

Nonetheless according to some example embodiments of inventive concepts, a metal wire constituting or corresponding to a sensing plus node SO+ may be arranged at the upper layer, and the sensing node SO may be electrically connected to the sensing plus node SO+, for example through a contact or a local interconnect. Accordingly, the page buffer PB may determine data of the memory cell by monitoring a cell current flowing through the sensing plus node SO+, and a metal wire constituting/corresponding to the boost node may be arranged at the upper layer. For example, as the metal wire constituting the boost node at the upper layer is arranged adjacent to the metal wire constituting the sensing plus node SO+, a level of a voltage applied to the boost node may be controlled, and a voltage of the sensing plus node SO+ may be boosted or boosted down.

In some example embodiments of inventive concepts, a sensing node sensing data stored in the memory cell may correspond to the sensing node SO illustrated in FIG. 2 or to the sensing plus node SO+, or may be a concept encompassing the metal wire constituting the sensing node SO of the lower layer and the metal wire constituting the sensing plus node SO+ of the upper layer. Hereinafter, various example embodiments of inventive concepts are described on the presumption that the sensing node of the page buffer PB is a concept encompassing the sensing node SO arranged at the lower layer and the sensing plus node SO+ arranged at the upper layer.

Figure 3:
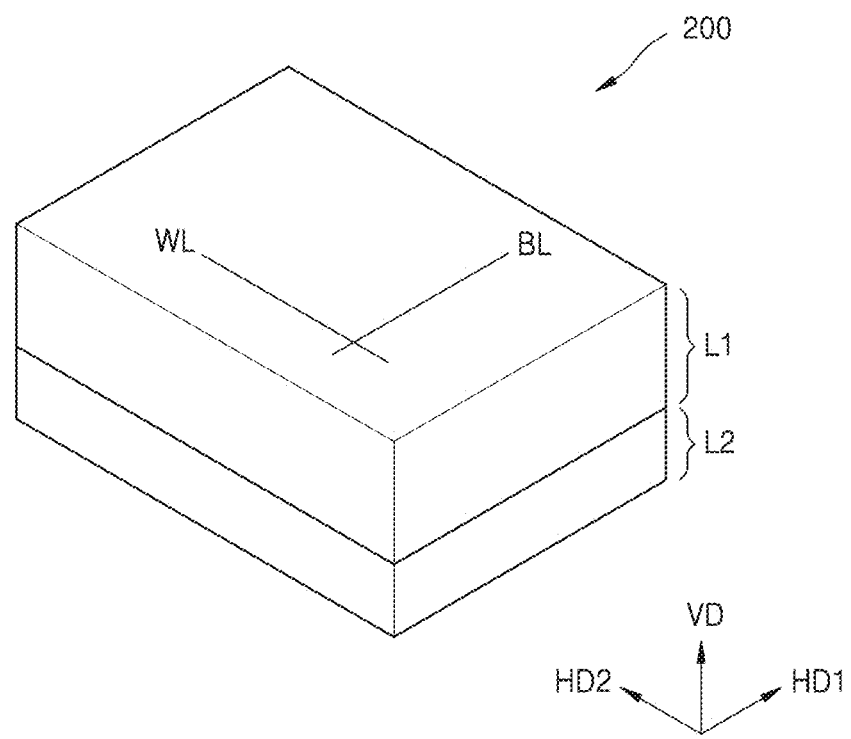
FIG. 3 is a schematic diagram of a structure of the memory device of FIG. 1 according to some example embodiments.
Figure 4:
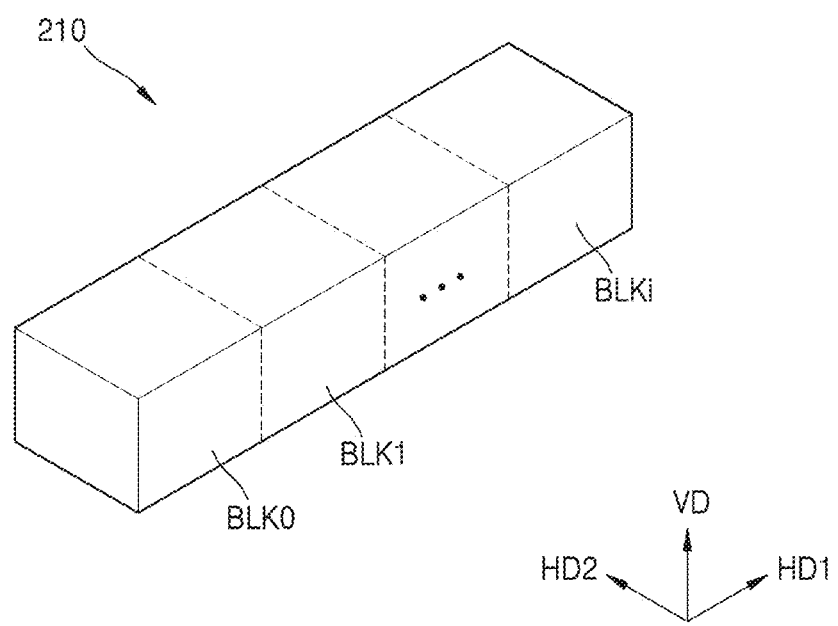
FIG. 4 is a diagram of an example of the memory cell array of FIG. 1.
Figure 5:
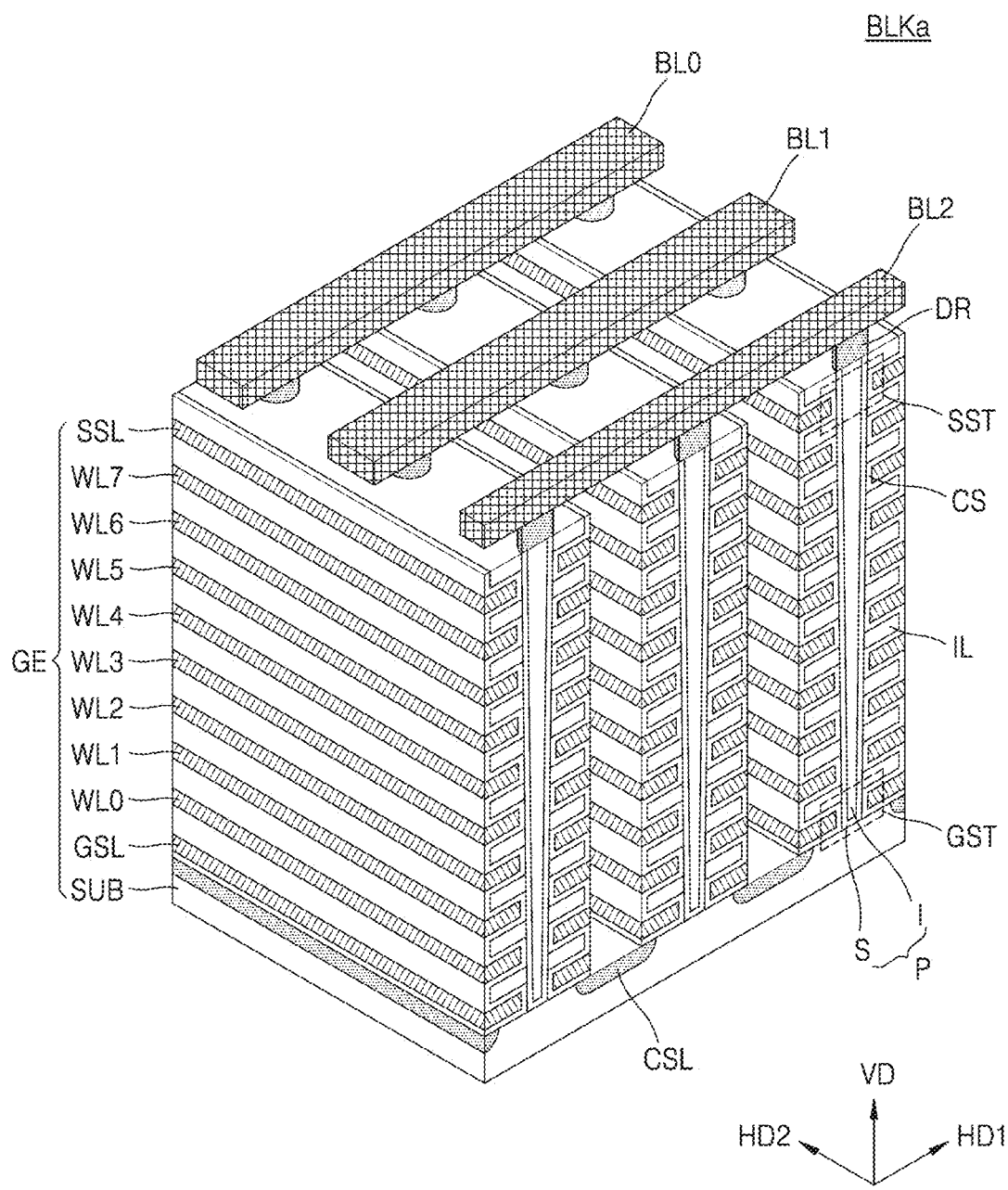
FIG. 5 is a perspective view of an example of a structure of the memory block of FIG. 4.

FIG. 3 is a schematic diagram of a structure of the memory device of FIG. 1 according to some example embodiments, FIG. 4 is a diagram of an example of the memory cell array 210 of FIG. 1, and FIG. 5 is a perspective view of an example of a structure of the memory block of FIG. 4. FIG. 3 illustrates a cell-over-periphery (COP) structure as various example embodiments of the memory device 200; however, example embodiments of inventive concepts are not limited thereto, and the memory device 200 may be implemented having various structures.

With reference to FIG. 3, the memory device 200 may include a first semiconductor layer L1 and a second semiconductor layer L2, and the first semiconductor layer L1 may be stacked on the second semiconductor layer L2 in a vertical direction VD. For example, the second semiconductor layer L2 may be arranged under the first semiconductor layer L1 in the vertical direction VD, and accordingly, the second semiconductor layer L2 may be located closed to a substrate.

In some example embodiments, the memory cell array 210 of FIG. 1 may be formed in the first semiconductor layer L1, and the peripheral circuit 201 of FIG. 1 may be formed in the second semiconductor layer L2. Accordingly, the memory device 200 may have a structure in which the memory cell array 210 is arranged on the peripheral circuit 201, e.g., a COP structure. The COP structure may effectively have a reduced a horizontal area and/or an improve a degree of integration of the memory device 200.

In some example embodiments, the second semiconductor layer L2 may include the substrate, and by forming transistors and/or metal patterns for wiring the transistors on or in the substrate, the peripheral circuit 201 may be formed in the second semiconductor layer L2. After the peripheral circuit 201 is formed in the second semiconductor layer L2, the first semiconductor layer L1 including the memory cell array 210 may be formed, and metal patterns for electrically connecting the word lines WL and the bit lines BL of the memory cell array 210 to the peripheral circuit 201 formed in the second semiconductor layer L2 may be formed. For example, the bit lines BL may extend in a first horizontal direction HD1, and the word lines WL may extend in a second horizontal direction HD2.

With reference to FIG. 4, the memory cell array 210 may include a plurality of memory blocks BLK0 to BLKi (i is a positive integer). Each of the plurality of memory blocks BLK0 to BLKi may have a three-dimensional (3D) structure (or a vertical structure). For example, the plurality of memory blocks BLK0 to BLKi may respectively include a plurality of NAND strings extending in the vertical direction VD. Here, the plurality of NAND strings may be apart from each other at a certain distance in the first and second horizontal directions HD1 and HD2. The plurality of memory blocks BLK0 to BLKi may be selected by the row decoder 250 of FIG. 1. For example, the row decoder 250 may select a memory block corresponding to a block address, among the plurality of the memory blocks BLK0 to BLKi.

With reference to FIG. 5, a memory block BLKa may be formed in the vertical direction with respect to a substrate SUB. The substrate SUB may be doped to have a first conductivity type (e.g., p type), and a common source line CSL doped with impurities of a second conductivity type (e.g., n type) and extending in the second horizontal direction HD2 may be provided on the substrate SUB. In a region of the substrate SUB between two adjacent common source lines CSL, a plurality of insulating films IL extending in the second horizontal direction HD2 may be sequentially provided in the vertical direction VD, and the plurality of insulating films IL may be spaced apart from each other at a certain distance in the vertical direction VD. For example, the plurality of insulating films IL may include an insulator, such as a silicon oxide.

In the region of the substrate SUB between two adjacent common source lines CSL, a plurality of pillars P sequentially arranged in the first horizontal direction HD1 and passing through the plurality of insulating films IL in the vertical direction VD may be provided. For example, the plurality of pillars P may pass through the plurality of insulating films IL and be in contact with the substrate SUB. For example, a surface layer S of each pillar P may include a silicon material of the first type, and function as a channel region. An internal layer I of each pillar P may include an insulator such as a silicon oxide or an air gap.

In a region between two adjacent common source lines CSL, a charge storage layer CS may be provided along the insulating films IL, the pillars P, and an exposed surface of the substrate SUB. The charge storage layer CS may include a gate insulating layer (or a tunneling insulating layer), a charge trap layer, and a blocking insulating layer. For example, the charge storage layer CS may have an oxide-nitride-oxide (ONO) structure. In addition, in the region between two adjacent common source lines CSL, a gate electrode GE, such as select lines GSL and SSL and word lines WL0 to WL7, may be provided on the exposed surface of the charge storage layer CS.

A plurality of drains and/or drain contacts DR may be respectively provided on the plurality of pillars P. For example, the drains and/or drain contacts DR may include a silicon material such as a polysilicon doped with impurities having the second conductivity type. On the drains DR, the bit lines BL1 to BL3 extending in the first horizontal direction HD1 and spaced apart from each other at a certain distance in the second horizontal direction HD2 may be provided.

Figure 7:
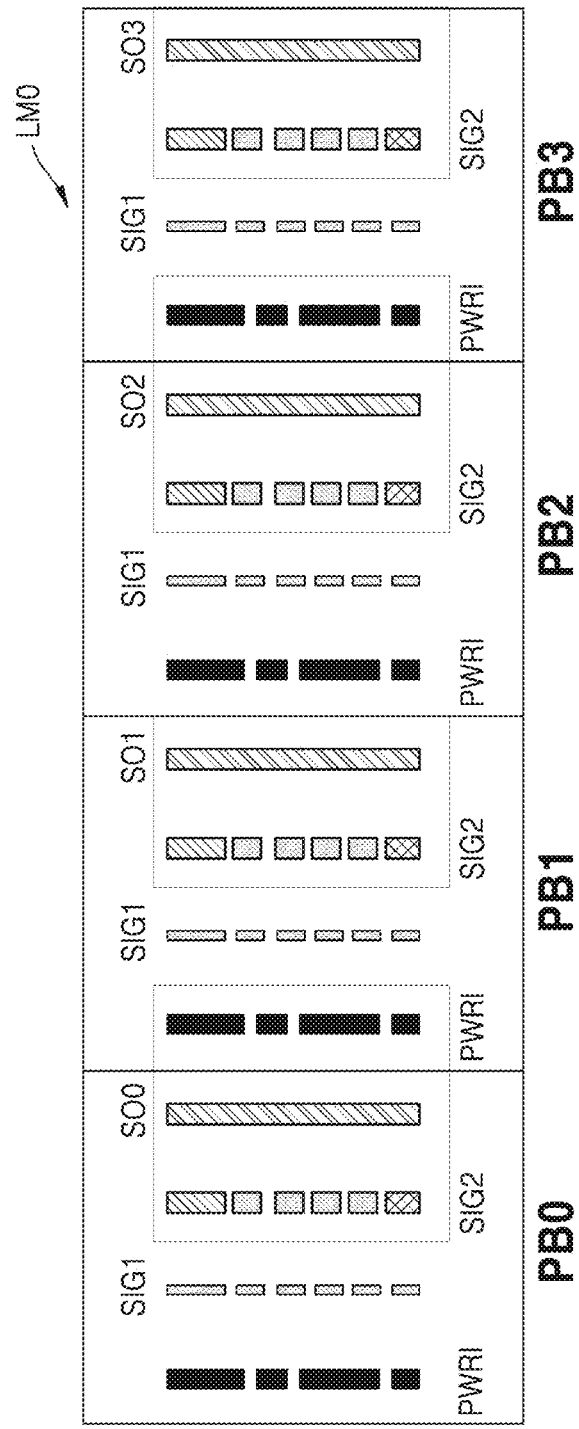
FIGS. 7 and 8 are diagrams illustrating implementation examples of a metal layer included in a page buffer according to some example embodiments.
Figure 8:
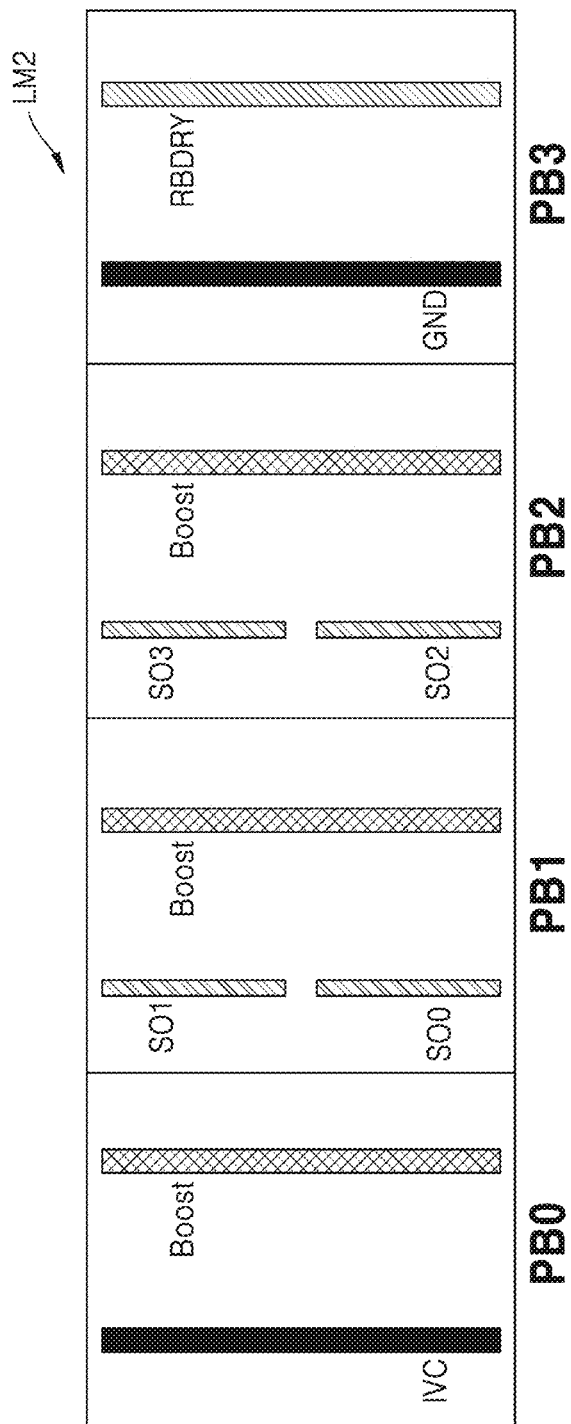

FIGS. 7 and 8 are diagrams illustrating implementation examples of a metal layer included in a page buffer according to some example embodiments. For example, each page buffer may be implemented as a metal layer region including a plurality of metal layers. For example, a first metal layer LM0, and a third metal layer LM2 of the metal layer region corresponding to each page buffer may be used for implementation of the page buffer. FIG. 7 illustrates various example embodiments of the first metal layer LM0 corresponding to the lower metal layer, and FIG. 8 illustrates various example embodiments of the third metal layer LM2 corresponding to the upper metal layer. Furthermore as described with reference to FIG. 9 below, a second metal layer LM1 may be between the first metal layer LM0 and the third metal layer LM2, and may extend in a direction intersecting the first and third metal layers LM0 and LM2.

In some example embodiments, the metal layer may be referred to as a conductive layer, and may not be limited to a layer formed of a metal material. For example the conductive layer may include doped polysilicon; however, example embodiments are not limited thereto. Moreover, a metal wire extending in the first direction may be arranged at each metal layer, and a plurality of metal wires may be arranged side-by-side in the second direction perpendicular to the first direction. Furthermore, a position in which each metal wire is arranged in the respective metal layers may be defined as a track, and accordingly, each metal layer may include a plurality of tracks on which a metal wire is arranged. On some tracks, a plurality of metal lines extending in the first direction and spaced apart from each other at a certain distance may be arranged. In some example embodiments, a metal wire may be defined and referred to as various terms, including a metal line, a metal pattern, etc.

FIG. 7 illustrates a plurality of page buffers (e.g., a first page buffer PB0, a second page buffer PB1, a third page buffer PB2, and a fourth page buffer PB3), and a plurality of metal wires may be arranged at the first metal layer LM0 of each of the first to fourth page buffers PB0 to PB3. For example, four metal wires may be arranged as shown in FIG. 7. The sensing node SO may require or desire a capacitance greater than or equal to a certain value to monitor an amount of cell current, and the sensing node SO may occupy a particular position in a layout of the page buffer to constitute the capacitance through a metal wire. In addition, a plurality of metal wires related to the operations of the page buffer may be arranged at the first metal layer LM0, and for example, a metal wire transmitting power PWR and a metal wire for routing among transistors included in the page buffer, and for transmitting various signals SIG1 and SIG2 may be arranged. A metal wire constituting or corresponding to the sensing node connected to a corresponding bit line and monitoring a cell current may be arranged at the first metal layer LM0 of each of the first to fourth page buffers PB0 to PB3, and sensing nodes SO0 to SO3 corresponding to the first to fourth page buffers PB0 to PB3 are described as an example.

When a size of a page buffer is reduced to improve a degree of integration of a memory device, a size of a transistor constituting the page buffer may also be reduced, which may lead to a decrease in the number of metal wires provided at the page buffer. In this case, a limitation may be posed on the arrangement of the metal wire (or metal capacitance) to implement the boost node according to various embodiments of inventive concepts. When the boost node is implemented by the capacitance of a gate of a separate transistor, an area of the page buffer may be increased.

FIG. 8 illustrates an example in which, when an area of the page buffer is minimized, a metal wire to implement a boost node for the virtual negative method is arranged at a third metal layer LM2. For example, as for the first to fourth page buffers PB0 to PB3, a metal wire transmitting a certain internal power voltage IVC to a metal wire constituting the boost node transmitting a boost voltage Boost may be arranged at the third metal layer LM2 of a metal layer region corresponding to the first page buffer PB0. In addition, a metal wire constituting the sensing node of the first page buffer PB0 and the second page buffer PB1 and a metal wire Boost constituting the boost node may be arranged at the third metal layer LM2 of a metal layer region corresponding to the second page buffer PB1. For example, the third metal layer LM2 corresponding to the second page buffer PB1 may have a structure in which a metal wire constituting the sensing node of the first page buffer PB0 and a metal wire constituting the sensing node of the second page buffer PB1 are spaced apart from each other at a certain predetermined or variably determined distance on the same track. To define the terms more specifically, the metal wire constituting the sensing node of the first page buffer PB0 and arranged at the third metal layer LM2 may be referred to as a first sensing plus node, and the metal wire constituting the sensing node of the second page buffer PB1 and arranged at the third metal layer LM2 may be referred to as a second sensing plus node.

Meanwhile, a metal wire constituting the sensing node of the third page buffer PB2 and the fourth page buffer PB3 and a metal wire constituting the boost node transmitting the boost voltage Boost may be arranged at the third metal layer LM2 of a metal layer region corresponding to the third page buffer PB2. For example, the third metal layer LM2 corresponding to the third page buffer PB2 may have a structure in which a metal wire constituting the sensing node of the third page buffer PB2 and a metal wire constituting the sensing node of the fourth page buffer PB3 are spaced apart from each other at a certain predetermined or variably determined distance on the same track. The metal wire constituting the sensing node of the third page buffer PB2 and arranged at the third metal layer LM2 may be referred to as a third sensing plus node, and the metal wire consti-tuting the sensing node of the fourth page buffer PB3 and arranged at the third metal layer LM2 may be referred to as a fourth sensing plus node.

Meanwhile, a metal wire transmitting a ground voltage GND and a metal wire transmitting a page buffer driver signal PBDRV may be arranged at the third metal layer LM2 in a metal layer region corresponding to the fourth page buffer PB3, and the metal wire transmitting the page buffer driver signal PBDRV may be connected to the column driver.

Various example embodiments above describe that the sensing plus nodes constituting the sensing node of two page buffers are located on the same track; however, example embodiments of inventive concepts are not limited thereto.

Figure 9:
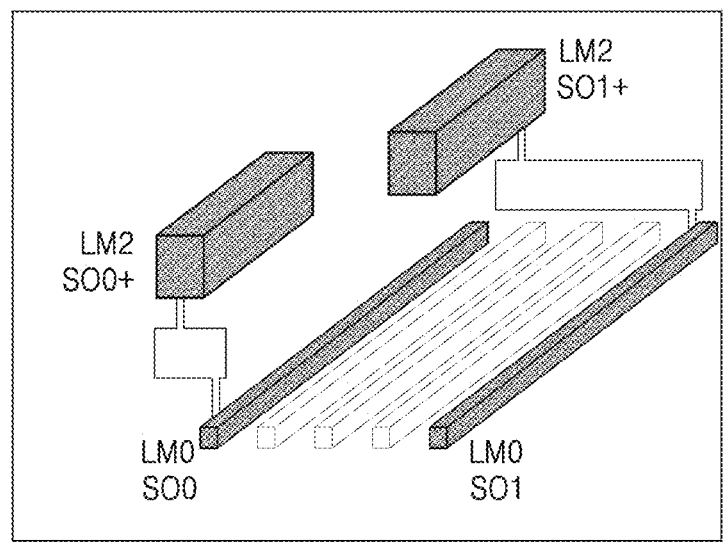
FIG. 9 is a structural diagram illustrating various example embodiments of a page buffer according to an example embodiment.

FIG. 9 is a structural diagram illustrating various example embodiments of a page buffer according to some example embodiments. FIG. 9 illustrates the first metal layer LM0 and the third metal layer LM2 provided at the first page buffer PB0 and the second page buffer PB1.

According to some example embodiments, to apply the virtual negative method, a metal wire constituting a boost node BN may be arranged adjacent to a first sensing plus node SO0+ of the third metal layer LM2, with a first sensing node SO0 of the first metal layer LM0 extended to the third metal layer LM2 through a contact, as illustrated in FIG. 9. For example, each of the first sensing node SO0 of the first metal layer LM0 and the first sensing plus node SO0+ may have a structure extending in the first direction, and the first sensing plus node SO0+ may be shorter than the first sensing node SO0.

In addition, a second sensing node SO1 of the first metal layer LM0 may be electrically connected to a second sensing plus node SO1+ of the third metal layer LM2 through a contact. At this time, the contact electrically connecting the second sensing node SO1 to the second sensing plus node SO1+ may have a structure extending in the second direction perpendicular to the first direction, and accordingly, the second sensing node SO1 and the second sensing plus node SO1+ may be spaced apart from each other at a certain distance in the second direction. In addition, the second sensing plus node SO1+ may be arranged on the third metal layer LM2 of a metal layer region corresponding to the first page buffer PB0.

Meanwhile, according to the structure described above, the first sensing plus node SO0+ and the second sensing plus node SO1+ respectively corresponding to different sensing nodes of different page buffers may be spaced apart from each other at a certain distance in the first direction, and the first sensing plus node SO0+ and the second sensing plus node SO1+ may not be adjacent to each other in the second direction, which leads to minimized effects between the metal wires implementing the first sensing plus node SO0+ and the second sensing plus node SO1+. Also, according to various implementation examples, the first sensing plus node SO0+ and the second sensing plus node SO1+ may be arranged on the same track at the third metal layer LM2 or may be spaced apart from each other at a certain distance in the second direction.

With reference to FIGS. 8 and 9, the first to fourth page buffers PB0 to PB3 may be implemented based on the components illustrated in FIGS. 8 and 9, and a boost or a boost-down of the first sensing plus node SO0+ and the second sensing plus node SO1+ may be controlled based on a voltage applied to the boost node arranged at both sides of the first sensing plus node SO0+ and the second sensing plus node 501+. Similarly, a boost or a boost-down of a third sensing plus node SO2+ and a fourth sensing plus node SO3+ may be controlled by a voltage applied to the boost node arranged at both sides of the third sensing plus node SO2+ and the fourth sensing plus node SO3+. Accordingly, a boost-up and/or a boost-down of a plurality of sensing nodes (or sensing plus nodes) may be equally controlled.

As illustrated in FIG. 9, tracks on which a plurality of metal wires are located may be provided between the first sensing node SO0 and the second sensing node SO1 of the first metal layer LM0. For example, the plurality of metal wires between the first sensing node SO0 and the second sensing node SO1 may be used for various purposes, for example, the metal wires between the first sensing node SO0 and the second sensing node SO1 may be used for transmitting an internal power voltage or a ground voltage, or for minimizing voltage variation of the sensing node by shielding the first sensing node SO0 (or a metal wire corresponding to the first sensing node SO0) and the second sensing node SO1 (or a metal wire corresponding to the second sensing node SO1).

Although it is not shown in various example embodiments described above, the second metal layer LM1 may also include metal wires for transmitting various signals. For example, the second metal layer LM1 may include a metal wire transmitting various signals related to the page buffer PB, and also the second metal layer LM1 may include a metal wire electrically connecting the first metal layer LM0 to the third metal layer LM2. According to various example embodiments, the metal wire arranged at the second metal layer LM1 may be implemented in a direction perpendicular to a metal wire arranged at the first metal layer LM0 and/or the third metal layer LM2. Moreover, the boost node may be driven (e.g., boosted or boosted down) by a peripheral circuit through a metal wire transmitting the page buffer driver signal PBDRV (e.g., a peripheral circuit arranged adjacent to the page buffer), and a metal wire transmitting the page buffer driver signal PBDRV and a metal wire constituting the boost node may be electrically connected to the metal wire arranged at the second metal layer LM1.

Figure 10:
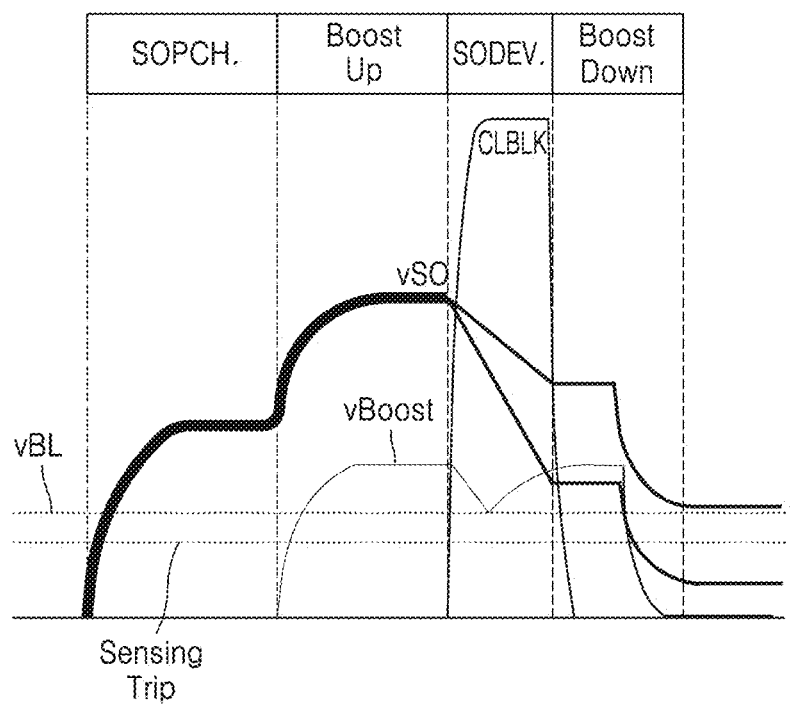
FIG. 10 is a diagram showing waveforms during a read operation according to some example embodiments.

FIG. 10 is a diagram showing waveforms during a read operation according to some example embodiments.

As described in various example embodiments above, to apply the virtual negative method to the data read operation, a voltage level of the common source line CSL, as well as a level of a bit line voltage vBL, may be increased. In monitoring a cell current through the sensing node in the page buffer, as a voltage of the sensing node vSO may be developed in a region higher than the bit line voltage vBL, the voltage of the sensing node vSO may be boosted immediately before a develop section SODEV of the sensing node. For example, as illustrated in FIG. 10, as the voltage of the sensing node vSO may be developed to become lower according to data stored in the memory cell, the voltage of the sensing node vSO needs to be greater than the level of the bit line voltage vBL, and accordingly, in the virtual negative method in which an increase in the level of the bit line voltage vBL is applied, a boost of the voltage of the sensing node vSO may be required.

Furthermore, as the voltage of the sensing node vSO is developed, a sensing trip of the page buffer may be defined as a data determination reference, and in the virtual negative method, the sensing trip level may be lower than the bit line voltage vBL level with increased bias. For example, the level of the bit line voltage vBL developed according to stored data needs to be higher or lower than the sensing trip level, and in some example embodiments, as the sensing trip is arranged lower than the level of the bit line voltage vBL, the voltage of the sensing node vSO may need to be boosted down immediately after the develop section SODEV of the sensing node.

With reference to FIG. 10, in a precharge section SOPCH of the sensing node, the voltage of the sensing node vSO may be precharged to a certain level, and as the voltage applied to the boost node vBoost is increased immediately before the develop section SODEV, the voltage of the sensing node vSO may be boosted and the level thereof may be increased. Moreover, in the develop section SODEV, the voltage of the sensing node vSO may be developed according to the data stored in the memory cell, and a gradient representing a decrease of the level of the voltage of the sensing node vSO may vary according to the data stored in the memory cell. The signal CLBLK illustrated in FIG. 10 may be a signal applied to a gate of a bit line connect transistor T_BLK to be described with reference to FIG. 13, and a logic high level may be maintained for electrical connection between the bit line and the sensing node during the develop section SODEV.

Meanwhile, immediately after the develop section SODEV, the voltage applied to the boost node vBoost may decrease so that the level of the voltage of the sensing node vSO has a lower value than the sensing trip level according to the data stored in the memory cell, and accordingly, the voltage of the sensing node vSO may be boosted down and a level thereof may also be lowered. In addition, after the voltage of the sensing node vSO is boosted down, data stored in the memory cell may be determined based on the voltage of the sensing node vSO.

Figure 11A:
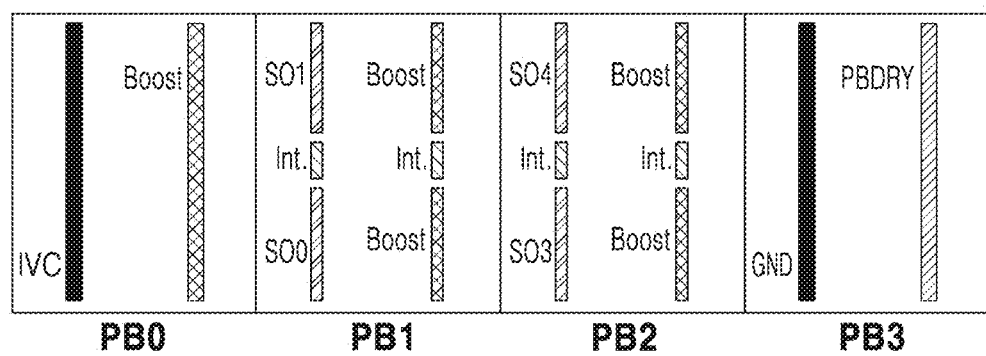
FIGS. 11A, 11B, and 11C are diagrams illustrating implementation examples of a metal layer included in a page buffer according to various embodiments.
Figure 11B:
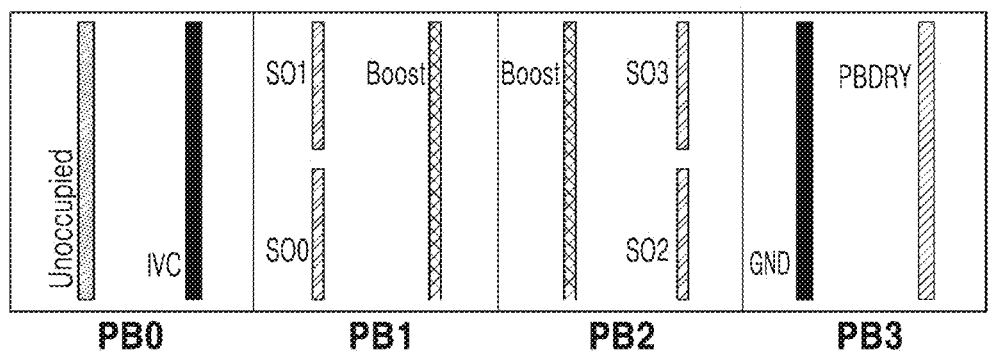
Figure 11C:
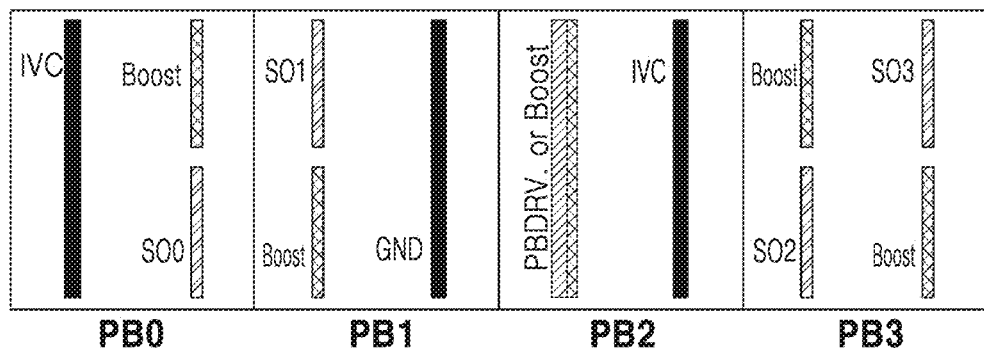

FIGS. 11A, 11B, and 11C are diagrams illustrating implementation examples of a metal layer included in a page buffer according to various embodiments. For example, FIGS. 11A, 11B, and 11C illustrate various example embodiments of the third metal layer LM2 of the first to fourth page buffers PB0 to PB3.

With reference to FIG. 11A, a metal wire transmitting the internal power voltage IVC and a metal wire constituting the boost node transmitting the boost voltage Boost may be arranged at the third metal layer LM2 corresponding to the first page buffer PB0. Moreover, a metal wire constituting the sensing node of the first page buffer PB0 and the second page buffer PB1 and a metal wire Boost constituting the boost node may be arranged at the third metal layer LM2 corresponding to the second page buffer PB1. FIG. 11 illustrates an example in which an additional metal wire is arranged on the track of the third metal layer LM2 corresponding to the second page buffer PB1, for example, a metal wire transmitting a certain signal may be arranged between the first sensing node SO0 and the second sensing node 501, or a metal wire Boost constituting the boost node may include two patterns between which a metal wire transmitting a certain signal may be arranged. For example, the additional metal wire may be used for internal routing of the page buffer, and the additional metal wire may not be arranged adjacent to the first sensing node SO0 and the second sensing node SO1 in the second direction.

Similarly, a metal wire constituting the sensing node of the third page buffer PB2 and the fourth page buffer PB3 and a metal wire Boost constituting the boost node may be arranged at the third metal layer LM2 corresponding to the third page buffer PB2, and a metal wire transmitting the ground voltage GND and a metal wire transmitting the page buffer driver signal PBDRV may be arranged at the metal layer LM2 corresponding to the fourth page buffer PB3. Furthermore, additional metal wires for internal routing may be further arranged at the third metal layer LM2 corresponding to the third page buffer PB2.

FIG. 11B illustrates another implementation example of the page buffer, for example, a metal wire may not be arranged on some tracks of the third metal layer LM2 corresponding to the first page buffer PB0, and a metal wire transmitting the internal power voltage IVC may be arranged on a track. A metal wire constituting the sensing node of the first page buffer PB0 and the second page buffer PB1 and a metal wire Boost constituting the boost node may be arranged at the third metal layer LM2 corresponding to the second page buffer PB1, and a metal wire Boost constituting the boost node and a metal wire constituting the sensing node of the third page buffer PB2 and the fourth page buffer PB3 may be arranged at the third metal layer LM2 corresponding to the third page buffer PB2. In addition, a metal wire transmitting the ground voltage GND and a metal wire transmitting the page buffer driver signal PBDRV may be arranged at the third metal layer LM2 corresponding to the fourth page buffer PB3.

Unlike the metal wire constituting the boost node and arranged at both sides in correspondence with each of the sensing nodes, according to the embodiment of FIG. 11, one adjacent boost node may be arranged in correspondence with each sensing node.

With reference to FIG. 11C, a metal wire transmitting the internal power voltage IVC, a metal wire constituting the boost node transmitting the boost voltage Boost, and a metal wire constituting the first sensing node SO0 may be arranged at the third metal layer LM2 corresponding to the first page buffer PB0. Moreover, a metal wire constituting the second sensing node SO1 a metal wire constituting the boost node, and a metal wire transmitting the ground voltage GND may be arranged at the third metal layer LM2 corresponding to the second page buffer PB1.

In various example embodiments, a metal wire constituting the first sensing node SO0 and a metal wire constituting the boost node may be implemented as separate patterns on the same track, and a metal wire constituting the second sensing node SO1 and the metal wire constituting the boost node may be implemented as separate patterns on the same track. At this time, a metal wire constituting the first sensing node SO0 and a metal wire constituting the boost node may not be adjacent to each other in the second direction at the third metal layer LM2 corresponding to the first page buffer PB0, and a metal wire constituting the second sensing node SO1 and the metal wire constituting the boost node may not be adjacent to each other in the second direction at the third metal layer LM2 corresponding to the second page buffer PB1. Accordingly, the boost/boost-down of the first sensing node SO0 may be controlled by the boost node arranged at the third metal layer LM2 corresponding to the second page buffer PB1, and the boost/boost-down of the second sensing node SO1 may be controlled by the boost node arranged at the third metal layer LM2 corresponding to the first page buffer PB0.

Similarly, a metal wire transmitting the page buffer driver signal PBDRV or a metal wire constituting the boost node may be arranged at the third metal layer LM2 corresponding to the third page buffer PB2, or a metal wire transmitting the internal power voltage IVC may be further arranged. Also, metal wires constituting the third page sensing node SO2 and the fourth sensing node SO3 and metal wires constituting the boost nodes may be arranged at the third metal layer LM2 corresponding to the fourth page buffer PB3.

Figure 12:
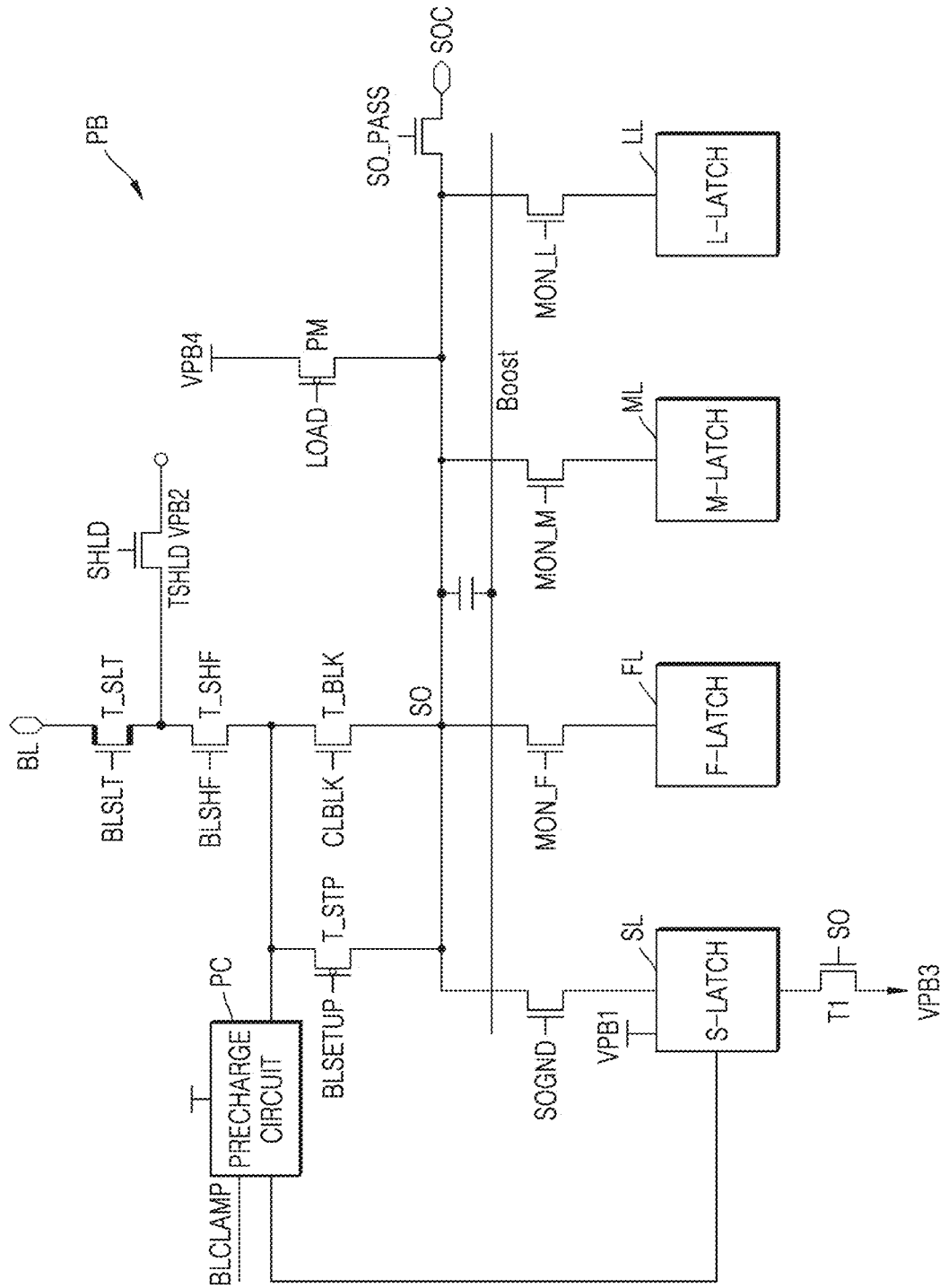
FIG. 12 is a diagram of a specific implementation example of a page buffer.

FIG. 12 is a diagram of a specific implementation example of a page buffer. FIG. 12 illustrates an example in which the page buffer PB includes a plurality of latches, for example, a sensing latch SL, a force latch FL, an upper bit latch ML, and a lower bit latch LL.

According to some example embodiments, the page buffer PB may include a bit line select transistor T_SLT connected to the bit line BL and driven by a bit line select signal BLSLT. The bit line select transistor T_SLT may be implemented as a high voltage transistor. In addition, the page buffer PB may further include transistors arranged between the latches and operated in response to various control signals (SOGND, MON_F, MON_M, and MON_L). The page buffer PB may further include a precharge circuit PC controlling a precharge operation with respect to the bit line BL or the sensing node SO based on a bit line clamping control signal BLCLAMP. Along with this, the page buffer PB may further include a setup transistor T_STP driven by a bit line setup signal BLSETUP and a precharge transistor PM driven by a load signal LOAD.

The latches may store various information, and for example, the sensing latch SL may store data stored in the memory cell or a sensing result of a threshold voltage of the memory cell during a read operation or a program verify operation. Moreover, the force latch FL may be used to improve a threshold voltage distribution during a program operation. The upper bit latch ML and the lower bit latch LL may be used to store data input from outside during the program operation.

Meanwhile, the page buffer PB may further include a shutoff transistor T_SHF and a bit line connect transistor T_BLK connected in series between the bit line select transistor T_SLT and the sensing node SO, as well as a recovery transistor T_SHLD connected to a node between the bit line select transistor T_SLT and the shutoff transistor T_SHF. The recovery transistor T_SHLD may become on/off in response to a recovery signal SHLD, and perform recovery of the bit line and the sensing node SO. The sensing latch SL may include an NMOS transistor electrically connected to the sensing node SO and changing data values to be stored in the latch circuit according to a level of the sensing node SO as a sensing transistor (hereinafter, referred to as a first transistor T1). FIG. 12 illustrates that a signal of the sensing node SO is provided to a gate of the first transistor T1; however, the gate of the first transistor T1 may be connected to the sensing node SO through a conductive line.

In the embodiment illustrated in FIG. 12, voltages or power levels of various levels may be provided to circuits in the page buffer PB, and wires transmitting multiple voltages may be separated. For example, a first voltage VPB1 may be a bit line bias source, and a second voltage VPB2 may be a common source line CSL bias source in the virtual negative method. Also, a third voltage VPB3 may be a bias source determining a trip level of the first transistor T1 for sensing the sensing node, and a fourth voltage VPB4 may be a bias source for precharging the sensing node.

Although FIG. 12 illustrates one component or a node to which the first to fourth voltages VPB1 to VPB4 are applied for convenience in explanation, the first to fourth voltages VPB1 to VPB4 may be provided to various circuits in the page buffer. For example, the first voltage VPB1 may be provided to one or more latches provided in the page buffer, the second voltage VPB2 may be provided to an electrode of the recovery transistor T_SHLD, and the fourth voltage VPB4 may be provided to an electrode of the precharge transistor PM.

In various example embodiments, the sensing node may be implemented by using a metal wire of a plurality of metal layers, and as illustrated in FIG. 12, a metal wire constituting the boost node may be further arranged at the page buffer PB. For example, according to various example embodiments described above, the metal wire constituting the boost node may be arranged at an upper layer, capacitance (intra-layer capacitance) may be implemented between the sensing node SO and the boost node, and through control of a voltage applied to the metal wire constituting the boost node, the sensing node SO may be boosted up or boosted down.

Figure 13:
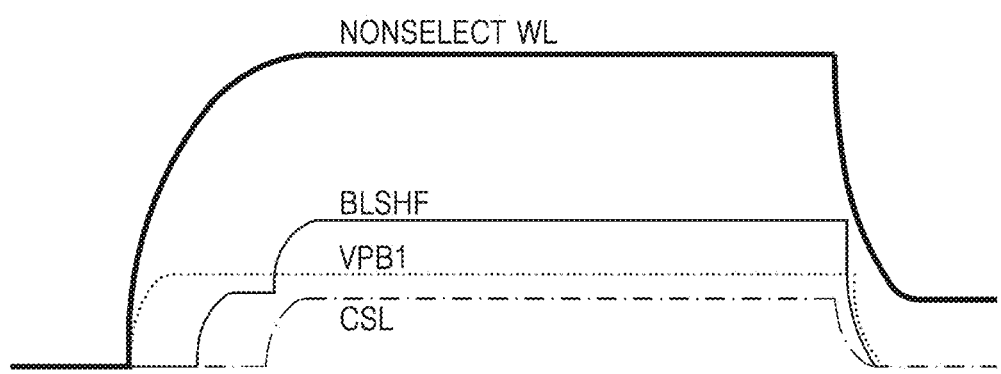
FIG. 13 is a waveform diagram showing an operation example in a sensing section in some example embodiments.

FIG. 13 is a waveform diagram showing an operation example in a sensing section in some example embodiments.

With reference to FIGS. 12 and 13, a pass voltage having a high level to turn on a non-select memory cell may be provided to a non-select word line. Also, in the virtual negative method, a voltage having a level higher than the ground voltage may be applied to the common source line CSL, and the first voltage VPB 1 as the bit line bias source may have a higher level than a voltage applied to the common source line CSL. To apply the first voltage VPB1 to the bit line, a bias higher than the first voltage VPB 1+ a threshold voltage of the shutoff transistor T_SHF may be applied to the shutoff transistor T_SHF.

When the memory device of inventive concepts includes charge-trap-flash (CTF) based memory cells, cell currents of the memory cells may be reduced according to a decrease in temperature. In such a case, when determining data based on a particular sensing reference current iCell, as the temperature of the memory device decreases, a level of the sensing reference current iCell may become lower. For example, an operation condition of the data read operation may be represented by the following Equation 1 where SO_Cap represents capacitance of a sensing node, Sensing_Trip represents a sensing trip level, iCell represents a level of a sensing reference current, and tSODEV represents a time of develop section.

$$SO\_Cap*(IVC-Sensing\_Trip)=tSODEV*iCell \quad \text{[Equation 1]}$$

In general, for temperature compensation in a read operation, the time of the develop section may increase according to a decrease in temperature of the memory device, which may cause deterioration of performance during the read operation. On the contrary, according to various example embodiments of inventive concepts, metal wires of a plurality of metal layers of the page buffer may be efficiently arranged, and the first to fourth voltages VPB1 to VPB4 may be transmitted through the metal wires in the page buffer.

According to some example embodiments, as the temperature of the memory device decreases, and a level of the third voltage VPB3 increases, the sensing trip level may be increased. In such a case, according to Equation 1 above, the level of the sensing reference current may be lowered without an increase of develop section. Also, when the temperature of the memory decreases, and a level of the fourth voltage VPB4 increases, a level of power voltage IVC precharging the sensing node may be lowered, and accordingly, the level of the sensing reference current may be lowered without an increase of develop section. In various example embodiments of inventive concepts, some of the tracks transmitting the internal power voltage IVC or power may be connected to the third voltage VPB3 or the fourth voltage VPB4, and by adjusting a voltage level applied to a metal wire of the track transmitting the internal power voltage IVC or power according to temperature changes of the memory device, the temperature changes may be compensated without an increase of the develop section.

Figure 14:
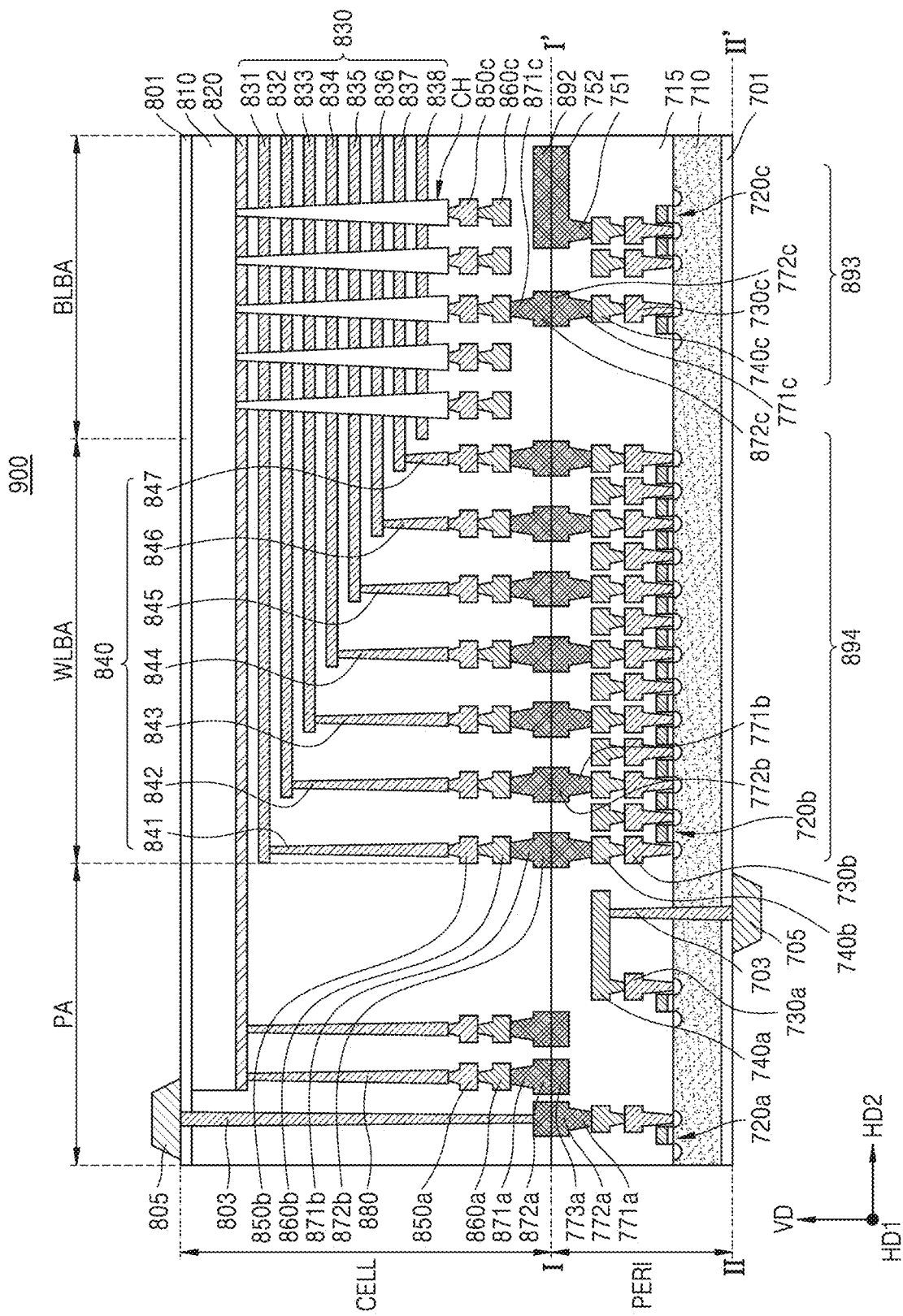
FIG. 14 is a cross-sectional view of a memory device according to some example embodiments.

FIG. 14 is a cross-sectional view of a memory device 900 according to some example embodiments.

With reference to FIG. 14, the memory device 900 may have a chip-to-chip (C2C) structure. The C2C structure may refer to a structure in which after an upper chip including a cell region CELL is formed on a first wafer, a lower chip including a peripheral circuit region PERI is formed on a second wafer different from the first wafer, and then the upper chip and the lower chip are bonded to each other. For example, the bonding method described above may mean a method to electrically connect a bonding metal formed at an uppermost metal layer of the upper chip to a bonding metal formed at a lowermost metal layer of the lower chip. For example, when the bonding metal is formed of copper (Cu), the bonding method may be a Cu—Cu bonding method, and the bonding metal may also be formed of aluminum or tungsten. Various example embodiments illustrated in FIGS. 1 to 13 may be implemented in the memory device 900, and for example, the page buffer circuit described with reference to FIGS. 1 to 13 may be arranged in the peripheral circuit region PERI.

The peripheral circuit region PERI and the cell region CELL of the memory device 900 may include an external pad bonding area PA, a word line bonding area WLBA, and a bit line bonding area BLBA. The peripheral circuit region PERI may include a first substrate 710, an interlayer insulating layer 715, a plurality of circuit elements 720a, 720b, and 720c formed on the first substrate 710, a first metal layer (730a, 730b, or 730c) connected to the plurality of circuit elements 720a, 720b, and 720c respectively, and a second metal layer (740a, 740b, or 740c) formed on the first metal layer (730a, 730b, or 730c) respectively. In some example embodiments, the first metal layer (730a, 730b, or 730c) may be formed of tungsten having a relatively high resistance, and the second metal layer (740a, 740b, or 740c) may be formed of copper having a relatively low resistance.

Although inventive concepts describe and illustrate only the first metal layer (730a, 730b, or 730c) and the second metal layer (740a, 740b, or 740c), inventive concepts are not limited thereto, and at least one metal layer may be further formed on the second metal layer (740a, 740b, or 740c). Some of the at least one metal layer formed on the second metal layer (740a, 740b, or 740c) may be formed of aluminum, etc. having a lower resistance than copper forming the second metal layer (740a, 740b, or 740c).

The interlayer insulating layer 715 may be arranged on the first substrate 710 to cover the plurality of circuit elements 720a, 720b, and 720c, the first metal layer (730a, 730b, or 730c), and the second metal layer (740a, 740b, or 740c) and may include an insulating material such as a silicon oxide, a silicon nitride, etc.

A lower bonding metal (771a or 772b) may be formed on the second metal layer 740b of the word line bonding area WLBA. In the word line bonding area WLBA, the lower bonding metal (771a or 772b) of the peripheral circuit region PERI may be electrically connected to an upper bonding metal (871a or 872b) of the cell region CELL through the bonding method, and the lower bonding metal (771a or 772b) and the upper bonding metal (871a or 872b) may be formed of aluminum, copper, tungsten, etc. The upper bonding metal (871a or 872b) of the cell region CELL may be referred to as first metal pads, and the lower bonding metal (771a or 772b) of the peripheral circuit region PERI may be referred to as second metal pads.

The cell region CELL may provide at least one memory block. The cell region CELL may include a second substrate 810 and a common source line 820. On the second substrate 810, a plurality of word lines 830 (831 to 838) may be stacked in the vertical direction VD on an upper surface of the second substrate 810. The string select lines and the ground select lines may be arranged above and below the word lines 830, and the plurality of word lines 830 may be arranged between the string select lines and the ground select lines.

In the bit line bonding area BLBA, a channel structure CH may extend in the direction perpendicular to an upper surface of the second substrate 810 and pass through the word lines 830, the string select lines, and the ground select lines. The channel structure CH may include a data storage layer, a channel layer, a buried insulating layer, etc., and the channel layer may be electrically connected to a first metal layer 850c and a second metal layer 860c. For example, the first metal layer 850c may be a bit line contact, and the second metal layer 860c may be a bit line. In some example embodiments, the bit line 860c may extend in the first horizontal direction HD1 parallel with the upper surface of the second substrate 810.

In various example embodiments illustrated in FIG. 14, a region in which the channel structure CH, the bit line 860c, etc. are arranged may be defined as the bit line bonding area BLBA. In the bit line bonding area BLBA, the bit line 860c may be electrically connected to circuit elements 720c providing a page buffer 893 in the peripheral circuit region PERI. For example, the bit line 860c may be connected to an upper bonding metal (871c and 872c) in the peripheral circuit region PERI, and the upper bonding metal (871c and 872c) may be connected to lower bonding metal (771c and 772c) connected to the circuit elements 720c of the page buffer 893.

In the word line bonding area WLBA, the word lines 830 may extend in the second horizontal direction HD2 parallel with the upper surface of the second substrate 810, and may be connected to a plurality of cell contact plugs 840 (841 to 847). As for the word lines 830 and the cell contact plugs 840, at least some of the word lines 830 may extend in different lengths in the second horizontal direction and may respectively be connected to the provided pads. A first metal layer 850b and a second metal layer 860b may be sequentially connected onto the cell contact plugs 840 connected to the word lines 830. The cell contact plugs 840 may be connected to the peripheral circuit region PERI through the upper bonding metal (871a or 872b) of the cell region CELL and the lower bonding metal (771a or 772b) of the peripheral circuit region PERI in the word line bonding area WLBA.

The cell contact plugs 840 may be electrically connected to the circuit elements 720b providing a row decoder 894 in the peripheral circuit region PERI. In some example embodiments, a driving voltage of the circuit elements 720b providing the row decoder 894 may be different from that of the circuit elements 720c providing the page buffer 893. For example, the driving voltage of the circuit elements 720c providing the page buffer 893 may be greater than that of the circuit elements 720b providing the row decoder 894.

A common source line contact plug 880 may be arranged in the external pad bonding area PA. The common source line contact plug 880 may be formed of a conductive material, such as a metal, a metal compound, polysilicon, etc., and may be electrically connected to the common source line 820. A first metal layer 850a and a second metal layer 860a may be sequentially stacked on the common source line contact plug 880. For example, a region in which the common source line contact plug 880, the first metal layer 850a, and the second metal layer 860a are arranged may be defined as the external pad bonding area PA.

Input/output pads (i.e., a first input/output pad 705 and a second input/output pad 805) may be arranged in the external pad bonding area PA. With reference to FIG. 14, a lower insulating film 701 covering a lower surface of the first substrate 710 may be formed under the first substrate 710, and the first input/output pad 705 may be formed on the lower insulating film 701. The first input/output pad 705 may be connected to at least one of the plurality of circuit elements 720a, 720b, and 720c arranged in the peripheral circuit region PERI through a first input/output contact plug 703, and may be separated from the first substrate 710 by the lower insulating film 701. Also, a lateral insulating film may be arranged between the first input/output contact plug 703 and the first substrate 710 to electrically separate the first input/output contact plug 703 from the first substrate 710.

With reference to FIG. 14, an upper insulating film 801 covering an upper surface of the second substrate 810 may be formed under the second substrate 810, and the second input/output pad 805 may be arranged on the upper insulating film 801. The second input/output pad 805 may be connected to at least one of the plurality of circuit elements 720a, 720b, and 720c arranged in the peripheral circuit region PERI through a second input/output contact plug 803.

According to some example embodiments, the second substrate 810, the common source line 820, etc. may not be arranged in a region in which the second input/output contact plug 803 is arranged. In addition, the second input/output pad 805 may not overlap the word lines 830 in a third direction (Z direction). With reference to FIG. 14, the second input/output contact plug 803 may be separated from the second substrate 810 in a direction parallel with the upper surface of the second substrate 810, and may be connected to the second input/output pad 805 by passing through an interlayer insulating layer 815 of the cell region CELL.

According to some example embodiments, the first input/output pad 705 and the second input/output pad 805 may be selectively formed. For example, a memory device 800 may only include the first input/output pad 705 arranged on the first substrate 710, or may only include the second input/output pad 805 arranged on the second substrate 810. Alternatively, the memory device 800 may include both of the first input/output pad 705 and the second input/output pad 805.

In the external pad bonding area PA and the bit line bonding area BLBA included in the cell region CELL and the peripheral circuit region PERI, respectively, metal patterns of an uppermost metal layer may exist as dummy patterns, or the uppermost metal layer may be vacant.

The memory device 800 may form a lower metal pattern 773a having the same shape as an upper metal pattern 872a of the cell region CELL at the uppermost metal layer of the peripheral circuit region PERI in correspondence with the upper metal pattern 872a formed at the uppermost metal layer of the cell region CELL. The lower metal pattern 773a formed at the uppermost metal layer of the peripheral circuit region PERI may not be connected to a separate contact in the peripheral circuit region PERI. Similarly, in the external pad bonding area PA, an upper metal pattern having the same shape as the lower metal pattern of the peripheral circuit region PERI may be formed at the upper metal layer of the cell region CELL in correspondence with the lower metal pattern formed at the uppermost metal layer of the peripheral circuit region PERI.

The lower bonding metal (771a or 772b) may be formed on the second metal layer 740b of the word line bonding area WLBA. In the word line bonding area WLBA, the lower bonding metal (771a or 772b) of the peripheral circuit region PERI may be electrically connected to the upper bonding metal (871*a* or 872*b*) of the cell region CELL though the bonding method.

Furthermore, in the bit line bonding area BLBA, an upper metal pattern 892 having the same shape as a lower metal pattern 752 of the peripheral circuit region PERI may be formed at the uppermost metal layer of the cell region CELL in correspondence with the lower metal pattern 752 formed at the uppermost metal layer of the peripheral circuit region PERI. A contact may not be formed on the upper metal pattern 892 formed at the uppermost metal layer of the cell region CELL.

Figure 15:
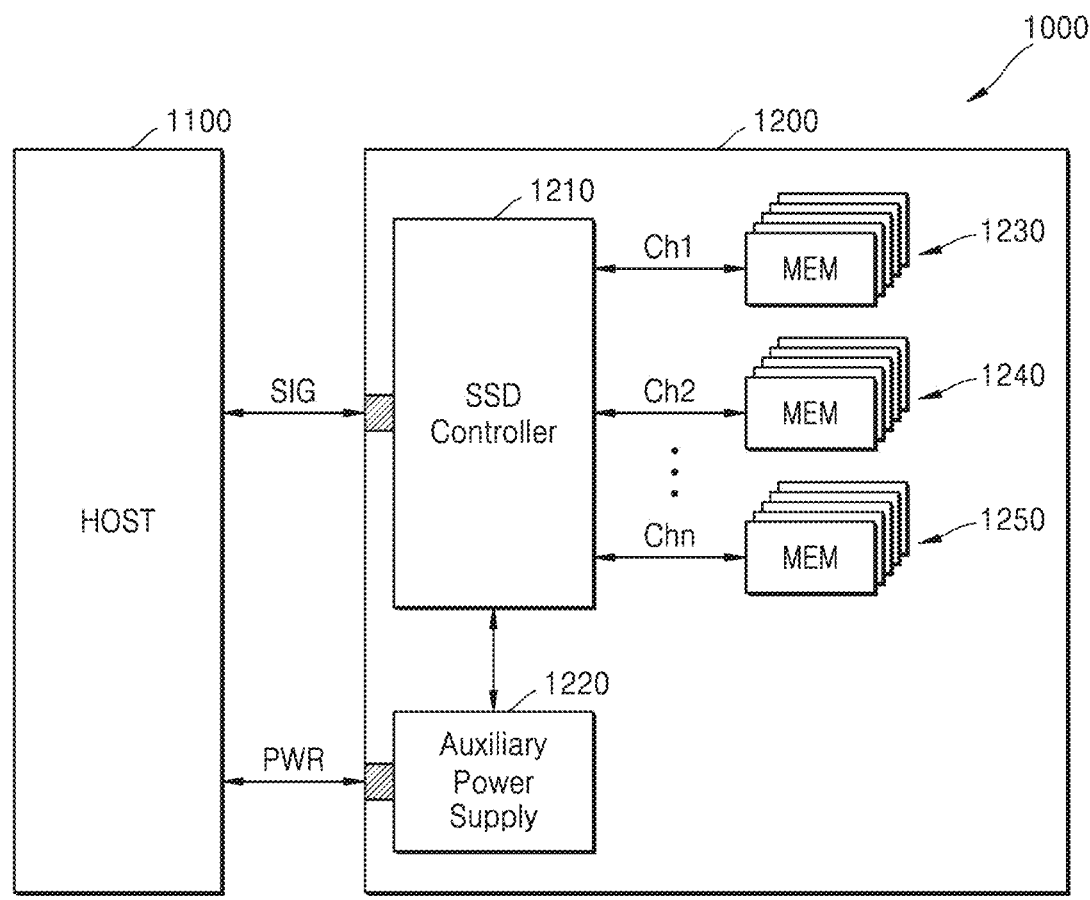
FIG. 15 is a block diagram illustrating an example of applying a memory device according to some embodiments to a solid state drive (SSD) system.

FIG. 15 is a block diagram illustrating an example of applying a memory device according to some example embodiments to a solid state drive (SSD) system.

With reference to FIG. 15, an SSD system 1000 may include a host 1100 and an SSD 1200. The SSD 1200 may exchange a signal with the host 1100 through a signal connector, and may receive power through a power connector. The SSD 1200 may include an SSD controller 1210, an auxiliary power supply 1220, and memory devices 1230, 1240, and 1250. The memory devices 1230, 1240, and 1250 may be a vertically stacked NAND flash memory device. The SSD 1200 may be implemented by using various example embodiments described with reference to FIGS. 1 to 14.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been particularly shown and described with reference to embodiments thereof, it will be understood that various changes in form and details may be made therein without departing from the spirit and scope of the following claims. Furthermore example embodiments are not necessarily mutually exclusive with one another. For example, some example embodiments may include one or more features described with reference to one or more figures, and may also include one or more other figures described with reference to one or more other figures. Still further although various functional blocks may be illustrated as being include within one block or the other, some or all functions performed by one block may be performed by others of the functional blocks. Still further unless otherwise specified one functional block may be able to communicate, e.g. wirelessly and/or in a wired manner, with other ones of the functional blocks, so as to transmit and/or receive various signals such as but not limited to data signals and/or command signals such as analog and/or digital signals, for example in a serial and/or a parallel manner.

What is claimed is:

1. A memory device comprising:
 a memory cell array including a plurality of memory cells; and
 a page buffer circuit connected to the memory cell array through a plurality of bit lines, the page buffer circuit including a plurality of page buffers which are arranged in correspondence with the bit lines and each of which includes a sensing node,
 wherein the plurality of page buffers include a first page buffer, and the first page buffer includes,
 a first sensing node configured to sense data, the first sensing node corresponding to a first metal wire at a lower metal layer and a second metal wire electrically connected to the first metal wire and at an upper metal layer above the lower metal layer, and
 the first page buffer further includes a boost node corresponding to a third metal wire adjacent to the second metal wire of the upper metal layer and configured to control a boost-up and a boost-down of a voltage of the first sensing node, wherein the third metal wire extends longer than the second metal wire.

2. The memory device of claim 1, further comprising:
 control logic configured to control a data read operation performed on the memory cell array and to control the first sensing node to be boosted up or boosted down by adjusting a voltage provided to the boost node during the data read operation.

3. The memory device of claim 1, wherein, in response to a data read operation performed on the memory cell array, the memory device is configured to apply a first voltage having a positive value a common source line connected to a memory cell, and is configured to apply a second voltage having a level higher than a level of the first voltage by a certain offset to a bit line connected to the memory cell.

4. The memory device of claim 3, wherein, before a develop section of the data read operation begins, as the first sensing node is boosted according to an increase in a voltage level applied to the boost node, a voltage level of the first sensing node becomes greater than a voltage level of the bit line.

5. The memory device of claim 4, wherein, after the develop section ends, as the first sensing node is boosted down according to a decrease in the voltage level applied to the boost node, the voltage level of the first sensing node becomes less than a sensing trip level, the voltage level of the first sensing node based on data stored in the memory cell.

6. The memory device of claim 1, wherein the first metal wire extends in a first direction, and the second metal wire extends in the first direction and is shorter than the first metal wire.

7. The memory device of claim 6, wherein the plurality of page buffers include a second page buffer adjacent to the first page buffer,
 the second page buffer includes:
 a second sensing node configured to sense data, the second sensing node corresponding to a fourth metal wire arranged at the lower metal layer, and
 a fifth metal wire at the upper metal layer and electrically connected to the fourth metal wire, wherein
 the memory device is configured to boost a voltage of the second sensing node up or down by a voltage applied to the boost node.

8. The memory device of claim 7, wherein
 the fifth metal wire extends in the first direction and is shorter than the first metal wire,
 the fifth metal wire is electrically connected to the fourth metal wire through a contact, the contact extending in a second direction perpendicular to the first direction, and the second metal wire and the fifth metal wire are spaced apart from each other at a certain distance in the first direction.

9. The memory device of claim 8, wherein at least one of
the second metal wire and the fifth metal wire are on a same track on the upper metal layer, or
the second metal wire and the fifth metal wire are not adjacent to each other in the second direction.

10. The memory device of claim 1, wherein the plurality of page buffers further include a second page buffer at an upper metal layer of the second page buffer, wherein at least one fourth metal wire transmitting at least one of a voltage adjusting a sensing trip level and a voltage precharging the sensing node is arranged, and
according to a temperature change of the memory device, a voltage level transmitted through the fourth metal wire varies and the temperature change is compensated.

11. A memory device comprising:
a memory cell array including a plurality of memory cells; and
a page buffer circuit connected to the memory cell array through a plurality of bit lines, the page buffer circuit including first to fourth page buffers which are side-by-side in correspondence with the bit lines and each of which includes a sensing node,
wherein each of the first to fourth page buffers includes an upper metal layer region and a lower metal layer region, each of the upper metal layer region and the lower metal region including one or more metal wires extending in a first direction,
a first sensing node of the first page buffer is configured to sense data, the first sensing node corresponding to a first metal wire in a lower metal layer region, the lower metal region corresponding to the first page buffer, and to a second metal wire electrically connected to the first metal wire through a contact, the contact extending in a second direction perpendicular to the first direction and the second metal wire arranged in an upper metal layer region corresponding to the second page buffer, and
the upper metal layer region corresponding to the second page buffer includes a first boost node configured to control a boost-up and a boost-down of a voltage of the first sensing node, the boost node corresponding to a third metal wire adjacent to the second metal wire,
wherein the third metal wire extends longer than the second metal wire.

12. The memory device of claim 11, wherein a second sensing node of the second page buffer is configured to sense data, the second sensing node corresponding to,
a fourth metal wire in a lower metal layer region, the lower metal region corresponding to the second page buffer, and
a fifth metal wire in the upper metal layer region the upper metal layer region corresponding to the second page buffer and electrically connected to the fourth metal wire through a contact.

13. The memory device of claim 12, wherein at least one of
the second metal wire and the fifth metal wire are on a same track on the upper metal layer region corresponding to the second page buffer, or
the second metal wire and the fifth metal wire are not adjacent to each other in the second direction.

14. The memory device of claim 12, wherein an upper metal layer region corresponding to the first page buffer includes a second boost node configured to control a boost-up and a boost-down of a voltage of the first sensing node and the second sensing node, the second boost node corresponding to a sixth metal wire adjacent to the second metal wire and the fifth metal wire.

15. The memory device of claim 14, wherein a third sensing node of the third page buffer is configured to sense data, the third sensing node corresponding to,
a seventh metal wire in a lower metal layer region corresponding to the third page buffer, and
an eighth metal wire in an upper metal layer region corresponding to the third page buffer and electrically connected to the seventh metal wire through a contact.

16. The memory device of claim 15, wherein a fourth sensing node of the fourth page buffer is configured to sense data, the fourth sensing node corresponding to,
a ninth metal wire in a lower metal layer region corresponding to the fourth page buffer, and
a tenth metal wire electrically connected to the ninth metal wire through a contact, and in an upper metal layer region corresponding to the fourth page buffer, the contact extending in the second direction.

17. The memory device of claim 16, wherein a third boost node configured to control a boost-up and a boost-down of a voltage of the third sensing node and the fourth sensing node by including an eleventh metal wire is in the upper metal layer region of the third page buffer, and
the eighth metal wire and the tenth metal wire are between the second boost node and the third boost node.

18. A page buffer circuit comprising:
a first page buffer and a second page buffer side-by-side in correspondence with a plurality of bit lines and each of which includes an upper metal layer region and a lower metal layer region, each of the upper metal layer region and the lower metal region including one or more metal wires extending in a first direction,
wherein a first sensing node of the first page buffer corresponds to,
a first metal wire in the lower metal layer region corresponding to the first page buffer, and
a second metal wire electrically connected to the first metal wire through a contact, the contact extending in a second direction perpendicular to the first direction and arranged in the upper metal layer region corresponding to the second page buffer,
wherein a second sensing node of the second page buffer corresponds to,
a third metal wire in the lower metal layer region corresponding to the second page buffer, and
a fourth metal wire electrically connected to the third metal wire and in the upper metal layer region corresponding to the second page buffer, and
wherein, in at least one of the upper metal layer region corresponding to the first page buffer and the upper metal layer region corresponding to the second page buffer, a boost node is adjacent to the second metal wire and the fourth metal wire and is configured to control a boost-up and a boost-down of a voltage of the first sensing node and the second sensing node, and
the third metal wire extends longer than the second metal wire.

19. The page buffer circuit of claim 18, wherein at least one of
the second metal wire and the fourth metal wire are on a same track on the upper metal layer region corresponding to the second page buffer, or
the second metal wire and the fourth metal wire are not adjacent to each other in the second direction.

20. The page buffer circuit of claim 18, wherein each of the second metal wire and the fourth metal wire extends in the first direction, and the second metal wire and the fourth metal wire are spaced apart from each other at a certain distance in the first direction.

\* \* \* \* \*